US012685123B2

(12) United States Patent
Lee et al.

(10) Patent No.: US 12,685,123 B2
(45) Date of Patent: Jul. 14, 2026

(54) SEMICONDUCTOR DEVICE AND METHOD OF FABRICATING THE SAME

(71) Applicant: Samsung Electronics Co., Ltd., Suwon-si (KR)

(72) Inventors: Kyoungwoo Lee, Suwon-si (KR); Yunsuk Nam, Suwon-si (KR); Jinkyu Kim, Suwon-si (KR); Sora You, Suwon-si (KR); Sungmoon Lee, Suwon-si (KR); Seungmin Cha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 371 days.

(21) Appl. No.: 18/347,765

(22) Filed: Jul. 6, 2023

(65) Prior Publication Data

US 2024/0170372 A1 May 23, 2024

(30) Foreign Application Priority Data

Nov. 17, 2022 (KR) ........................ 10-2022-0154480

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/014* (2025.01); *H10D 30/43* (2025.01);
(Continued)

(58) Field of Classification Search
CPC ............. H01L 23/481; H01L 21/76895; H01L 21/76897; H01L 21/76898; H01L 23/485; H01L 84/038; H01L 23/5286; H01L 21/762; H01L 21/76877; H01L 23/5226; H01L 23/5283; H10D 30/014; H10D 30/43; H10D 30/6729; H10D 30/6735; H10D 30/6757; H10D 62/121; H10D 64/017; H10D 84/85; H10D 84/0151;
(Continued)

(56) References Cited

U.S. PATENT DOCUMENTS 9,419,014 B2 8/2016 Gurumurthy
9,547,741 B2 1/2017 Schroeder et al.
(Continued)

*Primary Examiner* — William B Partridge
*Assistant Examiner* — David Paul Sedorook
(74) *Attorney, Agent, or Firm* — Harness, Dickey & Pierce, P.L.C.

(57) ABSTRACT

A semiconductor device may include first active patterns adjacent to each other on a substrate, first source/drain patterns respectively on the first active patterns and adjacent to each other, a first division structure and a second division structure crossing the first active patterns and arranged on the substrate such that adjacent ones of the first source/drain patterns are interposed between the first division structure and the second division structure, a first penetration via between adjacent ones of the first source/drain patterns, a first power line on the first penetration via and electrically connected to the first penetration via, a power delivery network layer on a bottom surface of the substrate, and a first lower penetration via between the power delivery network layer and the first penetration via.

18 Claims, 40 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/85* | (2025.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 64/017* (2025.01); *H10D 84/85* (2025.01)

(58) Field of Classification Search
CPC ...... H10D 84/981; H10D 84/83; H10D 89/10; H10D 84/017; H10D 84/0181; H10D 84/0186; H10D 84/0188; H10D 30/6713; H10D 64/254; H01D 84/0149
See application file for complete search history.

(56) References Cited

U.S. PATENT DOCUMENTS

| | | | |
|---|---|---|---|
| 10,700,207 | B2 | 6/2020 | Chen et al. |
| 2006/0071291 | A1* | 4/2006 | Yagishita ........... H10D 30/6735 |
| | | | 438/570 |
| 2017/0047328 | A1* | 2/2017 | Masuoka ............. H10D 30/711 |
| 2019/0131239 | A1* | 5/2019 | Kirimura ............ H01L 23/5226 |
| 2019/0164882 | A1* | 5/2019 | Chen ................... H10D 84/834 |
| 2020/0373331 | A1 | 11/2020 | Kim et al. |
| 2021/0118868 | A1 | 4/2021 | Sio et al. |
| 2021/0175171 | A1 | 6/2021 | Jung et al. |
| 2022/0122970 | A1 | 4/2022 | Do et al. |
| 2022/0139900 | A1 | 5/2022 | Oh et al. |
| 2022/0181258 | A1 | 6/2022 | Liebmann et al. |
| 2022/0223523 | A1 | 7/2022 | Lee et al. |
| 2023/0119286 | A1* | 4/2023 | More ................. H10D 84/0151 |
| | | | 257/288 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0154480, filed on Nov. 17, 2022, in the Korean Intellectual Property Office, the entire contents of which are hereby incorporated by reference.

BACKGROUND

The present disclosure relates to a semiconductor device and a method of fabricating the same, and in particular, to a semiconductor device including a field effect transistor and a method of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high-performance semiconductor devices.

SUMMARY

An embodiment of inventive concepts provides a semiconductor device with improved electrical and reliability characteristics.

An embodiment of inventive concepts provides a method of fabricating a semiconductor device with improved electrical and/or reliability characteristics.

According to an embodiment of inventive concepts, a semiconductor device may include a substrate; first active patterns adjacent to each other on the substrate; first source/drain patterns respectively on the first active patterns and adjacent to each other; a first division structure and a second division structure crossing the first active patterns and arranged on the substrate such that adjacent ones of the first source/drain patterns are between the first division structure and the second division structure; a first penetration via between the adjacent ones of the first source/drain patterns; a first power line on the first penetration via and electrically connected to the first penetration via; a power delivery network layer on a bottom surface of the substrate; and a first lower penetration via between the power delivery network layer and the first penetration via.

According to an embodiment of inventive concepts, a semiconductor device may include a substrate; a plurality of power lines on the substrate, the plurality of power lines arranged in a first direction and extending in a second direction, the plurality of power lines being parallel to each other; a plurality of logic cells two-dimensionally provided on an active region of the substrate; a plurality of tab cells arranged in the first direction on the substrate; and a power delivery network layer below the substrate. The plurality of tab cells may include a plurality of penetration vias. The plurality of penetration vias may be electrically connected to the plurality of power lines, respectively. The power delivery network layer may be configured to apply voltages to the plurality of power lines through the penetration vias. The plurality of logic cells may include a plurality of gate electrodes. The plurality of gate electrodes may be disposed in the second direction. A width of each of the plurality of tab cells in the second direction may be equal to a pitch between the plurality of gate electrodes or the width of each of the plurality of tab cells may be two times the pitch between the plurality of gate electrodes.

According to an embodiment of inventive concepts, a semiconductor device may include a substrate; a first power line and a second power line on the substrate, the first power line and the second power line being spaced apart from each other in a first direction and extending in a second direction to be parallel to each other; a logic cell and a tab cell between the first power line and the second power line, the logic cell and the tab cell being adjacent to each other in the second direction; a first active pattern and a second active pattern on the logic cell, the first active pattern and the second active pattern being spaced apart from each other in the first direction; a first channel pattern and a first source/drain pattern on the first active pattern; a second channel pattern and a second source/drain pattern on the second active pattern, a conductivity type of the second source/drain pattern being different than a conductivity type of the first source/drain pattern; a gate electrode on the first channel pattern and the second channel pattern; a gate insulating layer between the gate electrode and the first channel pattern and the second channel pattern; a gate spacer on a side surface of the gate electrode; a gate capping pattern on a top surface of the gate electrode; an interlayer insulating layer covering the first source/drain pattern, the second source/drain pattern, and the gate capping pattern; an active contact penetrating the interlayer insulating layer and being electrically connected to each of the first source/drain pattern and the second source/drain pattern; a metal-semiconductor compound layer between the active contact and each of the first source/drain pattern and the second source/drain pattern; a gate contact penetrating the interlayer insulating layer and the gate capping pattern, the gate contact being electrically connected to the gate electrode; a first division structure and a second division structure respectively provided on two borders of the tab cell, which are opposite each other in the second direction; a first penetration via and a second penetration via on the tab cell, the first penetration via and the second penetration via being electrically connected to the first power line and the second power line, respectively, and the first penetration via and the second penetration via each being interposed between the first division structure and the second division structure; a power delivery network layer on a bottom surface of the substrate; and a first lower penetration via and a second lower penetration via, which are respectively provided between the power delivery network layer and the first penetration via and the second penetration via.

According to an embodiment of inventive concepts, a method of fabricating a semiconductor device may include forming an active pattern on a substrate; forming sacrificial patterns on the active pattern, the sacrificial patterns extending in a first direction; forming a source/drain pattern between adjacent sacrificial patterns among the sacrificial patterns; forming an interlayer insulating layer to cover the sacrificial pattern and the source/drain pattern; replacing the sacrificial patterns with gate electrodes, respectively; forming a first division structure and a second division structure, the first division structure and the second division structure penetrating an adjacent pair of the gate electrodes, respectively; forming a penetration via between the first division structure and the second division structures; forming a power line on the penetration via; performing a planarization process on a bottom surface of the substrate; forming a lower penetration via, is the lower penetration via extending from the bottom surface of the substrate to the penetration via; and forming a power delivery network layer on the bottom surface of the substrate.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
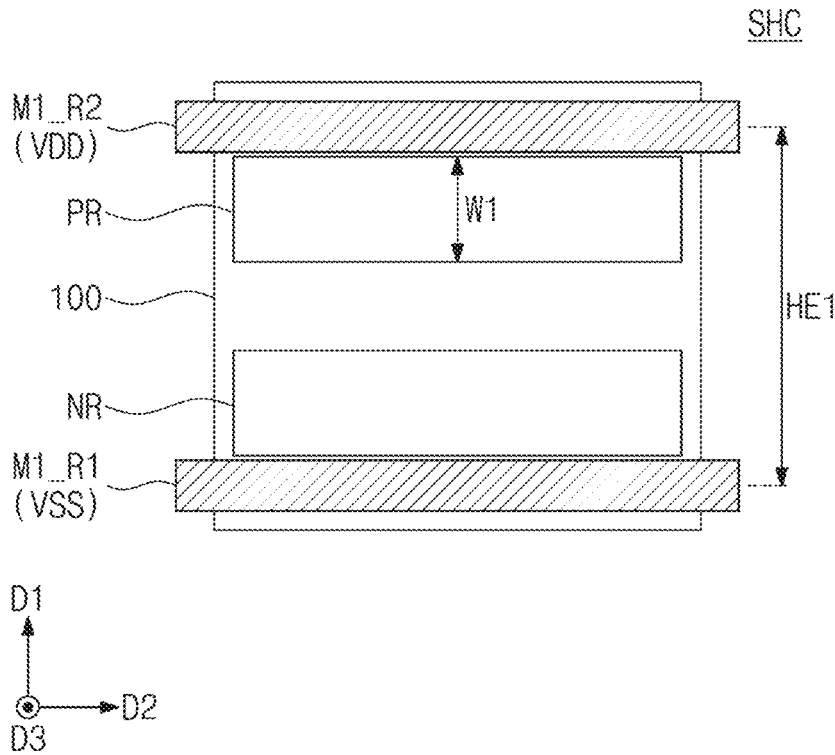
FIGS. 1 to 3 are conceptual diagrams illustrating logic cells in a semiconductor device according to an embodiment of inventive concepts.
Figure 2:
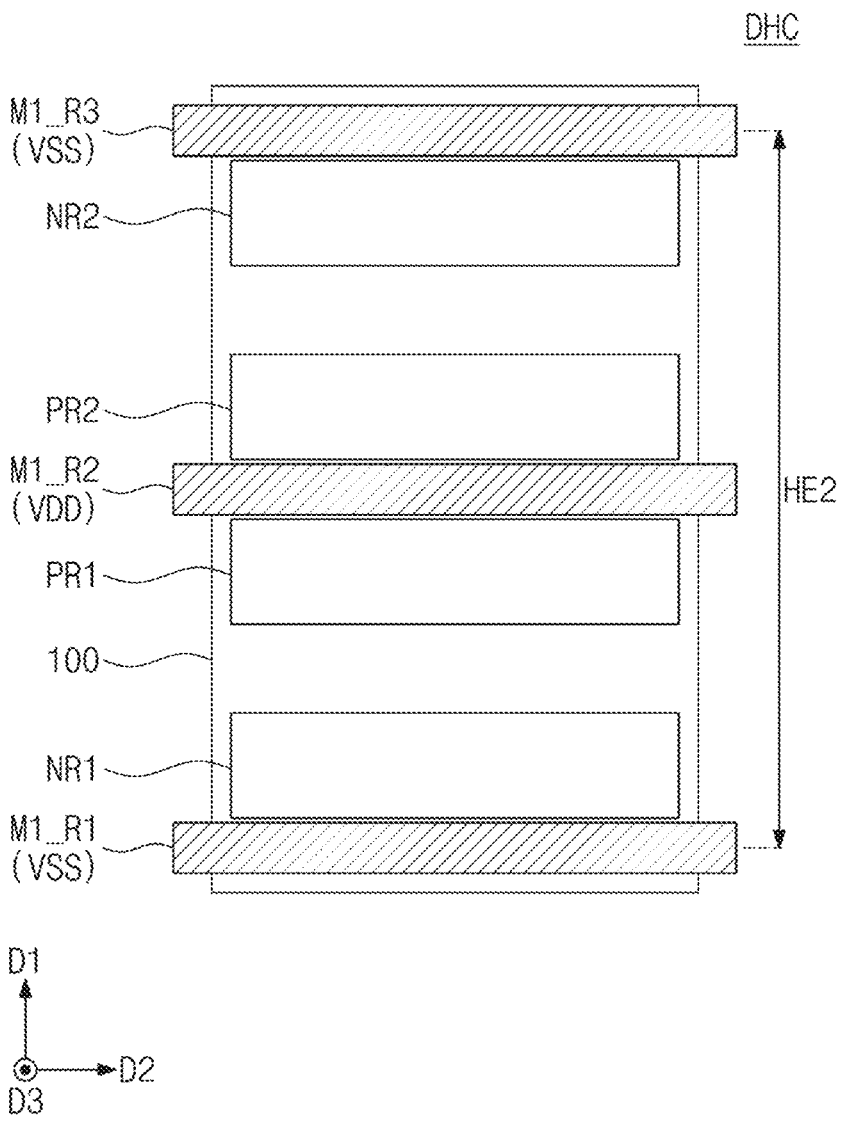
Figure 3:
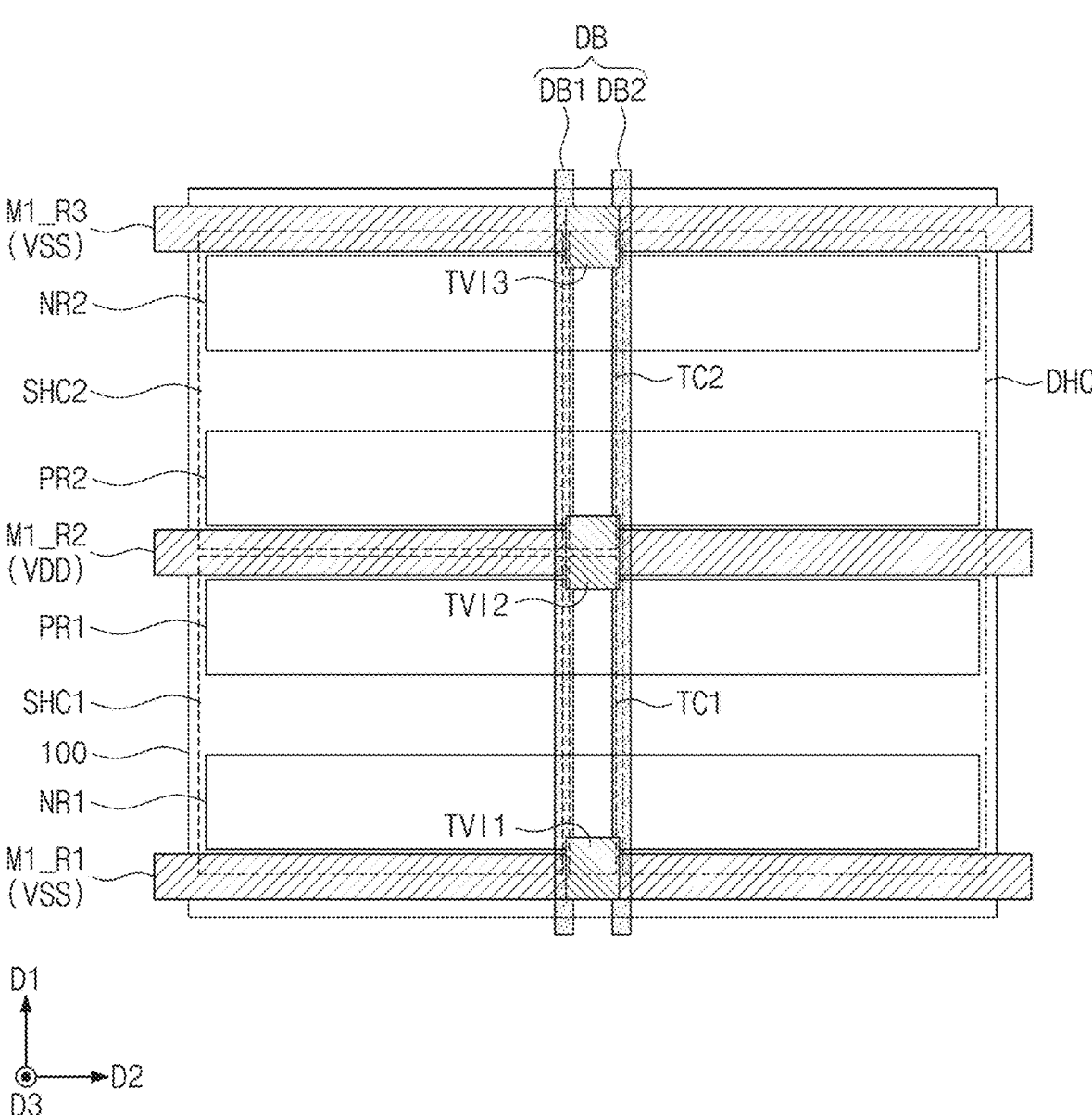

FIGS. 1 to 3 are conceptual diagrams illustrating logic cells in a semiconductor device according to an embodiment of inventive concepts.

Referring to FIG. 1, a single height cell SHC may be provided. In detail, a first power line M1_R1 and a second power line M1_R2 may be provided below a substrate 100. The first power line M1_R1 may be a conduction path, to which a source voltage VSS (e.g., a ground voltage) is provided. The second power line M1_R2 may be a conduction path, to which a drain voltage VDD (e.g., a power voltage) is provided.

The single height cell SHC may be defined between the first power line M1_R1 and the second power line M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The second power line M1_R2 may be disposed between the first power line M1_R1 and the third power line M1_R3. The third power line M1_R3 may be a conduction path, to which the source voltage VSS is provided.

The double height cell DHC may be defined between the first power line M1_R1 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the first power line M1_R1. The second NMOSFET region NR2 may be adjacent to the third power line M1_R3. The first and second PMOSFET regions PR1 and PR2 may be adjacent to the second power line M1_R2. When viewed in a plan view, the second power line M1_R2 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region. Thus, a channel size of the PMOS transistor of the double height cell DHC may be larger than a channel size of the PMOS transistor of the single height cell SHC of FIG. 1.

For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the second and third power lines M1_R2 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A first tab cell TC1 may be provided between the first single height cell SHC1 and the double height cell DHC. A second tab cell TC2 may be provided between the second single height cell SHC2 and the double height cell DHC. The first tab cell TC1 and the second tab cell TC2 may be aligned to each other in the first direction D1.

Each of the first and second tab cells TC1 and TC2 may be a cell, which is configured to apply a voltage from a power delivery network, which will be described below, to at least one of the power lines M1_R1 to M1_R3. The tab cell may not include the logic device, unlike the logic cell. That is, the tab cell may be configured to apply a voltage to the power line but may be just a dummy cell that does not serve as a circuit element.

As illustrated in FIG. 3, the first and second tab cells TC1 and TC2 may be disposed in a cell region with the logic cells SHC1, SHC2, and DHC to be placed between the logic cells SHC1, SHC2, and DHC. FIG. 3 illustrates an example of how the first and second tab cells TC1 and TC2 and the logic cells SHC1, SHC2, and DHC can be arranged, but there may be many other possible arrangements for the logic and tab cells.

In an embodiment, a first division structure DB1 may be provided between the first tab cell TC1 and the first single height cell SHC1 and between the second tab cell TC2 and the second single height cell SHC2. A second division structure DB2 may be provided between the first tab cell TC1 and the double height cell DHC and between the second tab cell TC2 and the double height cell DHC. An active region of the logic cell SHC1, SHC2, or DHC may be electrically disconnected from an active region of the tab cell TC1 or TC2 by a division structure DB.

The first and second tab cells TC1 and TC2 may include first to third penetration vias TVI1, TVI2, and TVI3, which are connected to the first to third power lines M1_R1, M1_R2, and M1_R3, respectively. The first to third power lines M1_R1, M1_R2, and M1_R3 may be electrically connected to a power delivery network, which is disposed below the substrate 100, through the first to third penetration vias TVI1, TVI2, and TVI3.

Figure 4:
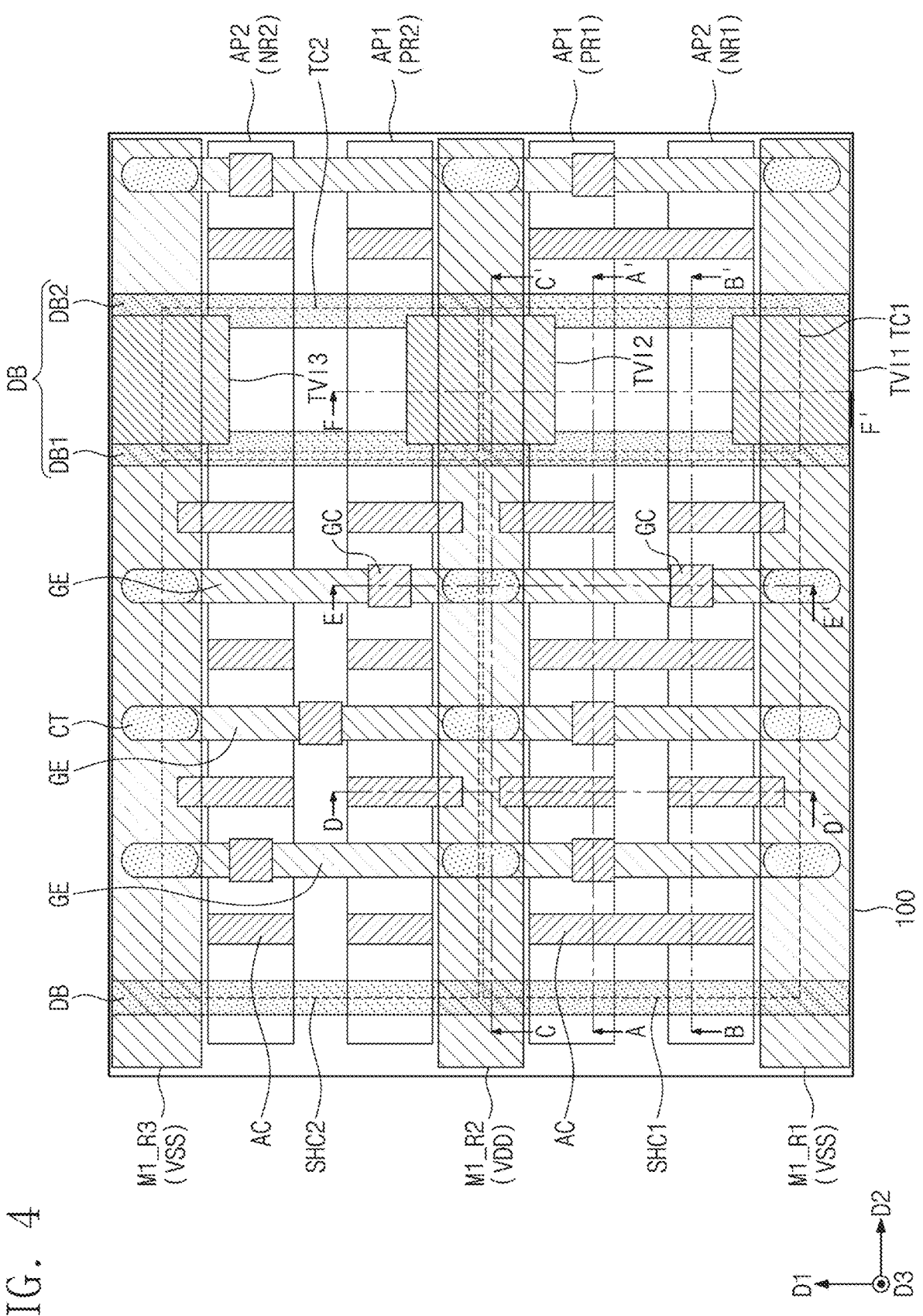
FIG. 4 is a plan view illustrating a semiconductor device according to an embodiment of inventive concepts.

FIG. 4 is a plan view illustrating a semiconductor device according to an embodiment of inventive concepts. FIGS. 5A to 5F are sectional views taken along lines A-A', B-B', C-C', D-D', E-E, and F-F' of FIG. 4, respectively. FIGS. 4 and 5A to 5F illustrate a detailed example of the semiconductor device shown in FIG. 3, including the first and second single height cells SHC1 and SHC2 and the first and second tab cells TC1 and TC2.

Referring to FIG. 4 and FIGS. 5A to 5F, the first and second single height cells SHC1 and SHC2 and the first and second tab cells TC1 and TC2 may be provided on the substrate 100. Logic transistors constituting a logic circuit may be disposed on each of the first and second single height cells SHC1 and SHC2. Dummy transistors may be disposed on each of the first and second tab cells TC1 and TC2. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may be extended in the second direction D2. Each of the first and second active patterns AP1 and AP2 may be a vertically-protruding portion of the substrate 100.

A device isolation layer ST may be provided to fill the trench TR. The device isolation layer ST may be formed of or include silicon oxide. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon. In an embodiment, each of the first to third semiconductor patterns SP1, SP2, and SP3 may be a nanosheet.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between a pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. As an example, a top surface of each of the first and second source/drain patterns SD1 and SD2 may be positioned at substantially the same level as a top surface of the third semiconductor pattern SP3.

However, in an embodiment, the top surface of each of the first and second source/drain patterns SD1 and SD2 may be higher than the top surface of the third semiconductor pattern SP3.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a buffer layer BFL and a main layer MAL on the buffer layer BFL. Referring back to FIG. 5A, the buffer layer BFL may cover an inner surface the first recess RS1. In an embodiment, the buffer layer BFL may have a substantially conformal thickness. For example, a thickness of the buffer layer BFL, which is measured in the third direction D3 on a bottom of the first recess RS1, may be substantially equal to a thickness of the buffer layer BFL, which is measured in the second direction D2 at a top level of the first recess RS1.

In an embodiment, the buffer layer BFL may have a decreasing thickness in an upward direction. For example, the thickness of the buffer layer BFL, which is measured in the third direction D3 on the bottom of the first recess RS1, may be larger than a thickness of the buffer layer BFL, which is measured in the second direction D2 at the top level of the first recess RS1. In addition, the buffer layer BFL may have a 'U'-shaped section corresponding to a profile of the first recess RS1.

The main layer MAL may fill most of an unfilled region of the first recess RS1 covered with the buffer layer BFL. The main layer MAL may have a volume that is greater than that of the buffer layer BFL. Each of the buffer and main layers BFL and MAL may be formed of or include silicon germanium (SiGe). In detail, the buffer layer BFL may contain a relatively low concentration of germanium (Ge). In another embodiment, the buffer layer BFL may contain only silicon (Si), without germanium (Ge). A germanium concentration of the buffer layer BFL may range from 0 at % to 10 at %.

The main layer MAL may contain a relatively high concentration of germanium. In an embodiment, the germanium concentration of the main layer MAL may range from 30 at % to 70 at %. The germanium concentration of the main layer MAL may increase in the third direction D3. For example, a portion of the main layer MAL, which is adjacent to the buffer layer BFL, may have a germanium concentration of about 40 at %, and an upper portion of the main layer MAL may have a germanium concentration of about 60 at %.

Each of the buffer and main layers BFL and MAL may contain an impurity (e.g., boron, gallium, or indium) that allows the first source/drain pattern SD1 to have a p-type conductivity. The impurity concentration of each of the buffer and main layers BFL and MAL may range from 1E18 atoms/cm$^3$ to 5E22 atoms/cm$^3$. The impurity concentration of the main layer MAL may be higher than the impurity concentration of the buffer layer BFL.

The buffer layer BFL may limit and/or prevent a stacking fault between the substrate 100 (e.g., the first active pattern AP1) and the main layer MAL and between the first to third semiconductor patterns SP1, SP2, and SP3 and the main layer MAL. The stacking fault may lead to an increase of a channel resistance. The buffer layer BFL may be used to protect the main layer MAL in a process of replacing second semiconductor layers SAL with first to third inner electrodes PO1, PO2, and PO3 of a gate electrode GE, as will be described below. In other words, the buffer layer BFL may limit and/or prevent an etchant material, which is used to remove the second semiconductor layers SAL, from entering and etching the main layer MAL.

Each of the second source/drain patterns SD2 may be formed of or include silicon (Si). The second source/drain pattern SD2 may further contain impurities (e.g., phosphorus, arsenic, or antimony) that allow the second source/drain pattern SD2 to have an n-type conductivity. The impurity concentration of the second source/drain pattern SD2 may range from 1E18 atom/cm$^3$ to 5E22 atom/cm$^3$.

The gate electrodes GE may be provided to cross the first and second channel patterns CH1 and CH2 and to extend in the first direction D1. The gate electrodes GE may be arranged at a first pitch in the second direction D2. Each of the gate electrodes GE may be vertically overlapped with the first and second channel patterns CH1 and CH2.

The gate electrode GE may include a first inner electrode PO1 interposed between the active pattern AP1 or AP2 and the first semiconductor pattern SP1, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

Referring back to FIG. 5E, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Gate cutting patterns CT may be provided on a boundary region between the first and second single height cells SHC1 and SHC2. The gate cutting patterns CT may be arranged at the first pitch along the boundary. When viewed in a plan view, the gate cutting patterns CT may be disposed to be overlapped with the gate electrodes GE, respectively. The gate cutting patterns CT may be formed of or include at least one of insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE, which are placed on the first and second single height cells SHC1 and SHC2 aligned to each other in the first direction D1. That is, the gate electrode GE extending in the first direction D1 may be divided into a plurality of the gate electrodes GE by the gate cutting patterns CT.

Referring back to FIG. 4 and FIGS. 5A to 5F, a pair of gate spacers GS may be respectively disposed on opposite side surfaces of the outer electrode PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may be a multi-layered structure, which includes at least two different materials selected from SiCN, SiCON, and SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and opposite side surfaces SW1 and SW2 of each of the first to third semiconductor patterns SP1, SP2, and SP3. The gate insulating layer GI may cover the top surface of the device isolation layer ST below the gate electrode GE.

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third inner electrodes PO1, PO2, and PO3 of the gate electrode GE may be composed of the first metal pattern including the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). In an embodiment, the outer electrode PO4 of the gate electrode GE may include the first metal pattern and the second metal pattern on the first metal pattern.

Referring back to FIG. 5B, inner spacers IP may be provided on the first and second NMOSFET regions NR1 and NR2. That is, the inner spacers IP may be provided on the second active pattern AP2. The inner spacers IP may be respectively interposed between the second source/drain pattern SD2 and the first to third inner electrodes PO1, PO2, and PO3 of the gate electrode GE. The inner spacers IP may be in direct contact with the second source/drain pattern SD2. Each of the first to third inner electrodes PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

The division structures DB may be respectively provided on boundaries between the cells. For example, the first division structure DB1 may be provided between the first and second single height cells SHC1 and SHC2 and the first and second tab cells TC1 and TC2. The second division structure DB2 may be provided between the first and second tab cells TC1 and TC2 and other logic cells adjacent thereto. Each of the first and second tab cells TC1 and TC2 may be provided between a pair of the division structures DB1 and DB2.

The division structure DB may be extended in the first direction D1 to be parallel to the gate electrodes GE. A pitch between the division structure DB and the gate electrode GE, which are adjacent to each other, may be equal to the first pitch. In an embodiment, a width of each of the first and second tab cells TC1 and TC2 in the second direction D2 may be substantially equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of one cell from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may be provided to cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Gate contacts GC may be provided to penetrate the second interlayer insulating layer 120 and the gate capping pattern GP and may be electrically connected to the gate electrodes GE, respectively. When viewed in a plan view, two gate contacts GC on the first single height cell SHC1 may be disposed to be overlapped with the first PMOSFET region PR1. That is, the two gate contacts GC on the first single height cell SHC1 may be provided on the first active pattern AP1 (e.g., see FIG. 5A). When viewed in a plan view, one gate contact GC on the first single height cell SHC1 may be disposed to be overlapped with the first NMOSFET region NR1. In other words, the one gate contact GC on the first single height cell SHC1 may be provided on the second active pattern AP2 (e.g., see FIG. 5B).

The gate contact GC may be freely disposed on the gate electrode GE, without any restrictions on its position. For example, the gate contacts GC on the second single height cell SHC2 may be respectively disposed on the second PMOSFET region PR2, the second NMOSFET region NR2, and the device isolation layer ST filling the trench TR (e.g., see FIG. 4).

Figure 5A:
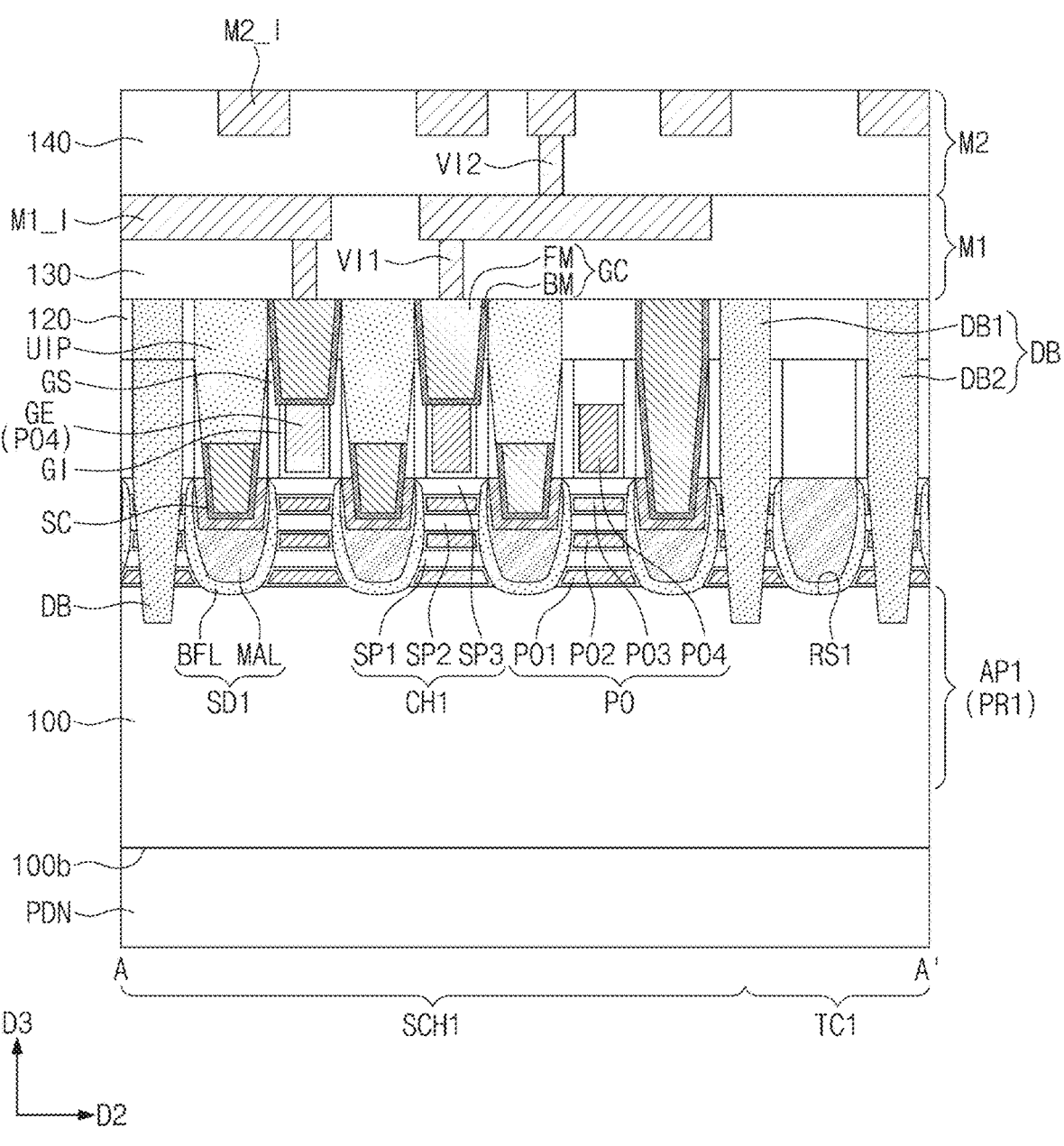
FIGS. 5A to 5F are sectional views taken along lines A-A', B-B', C-C', D-D', E-E', and F-F' of FIG. 4, respectively.
Figure 5B:
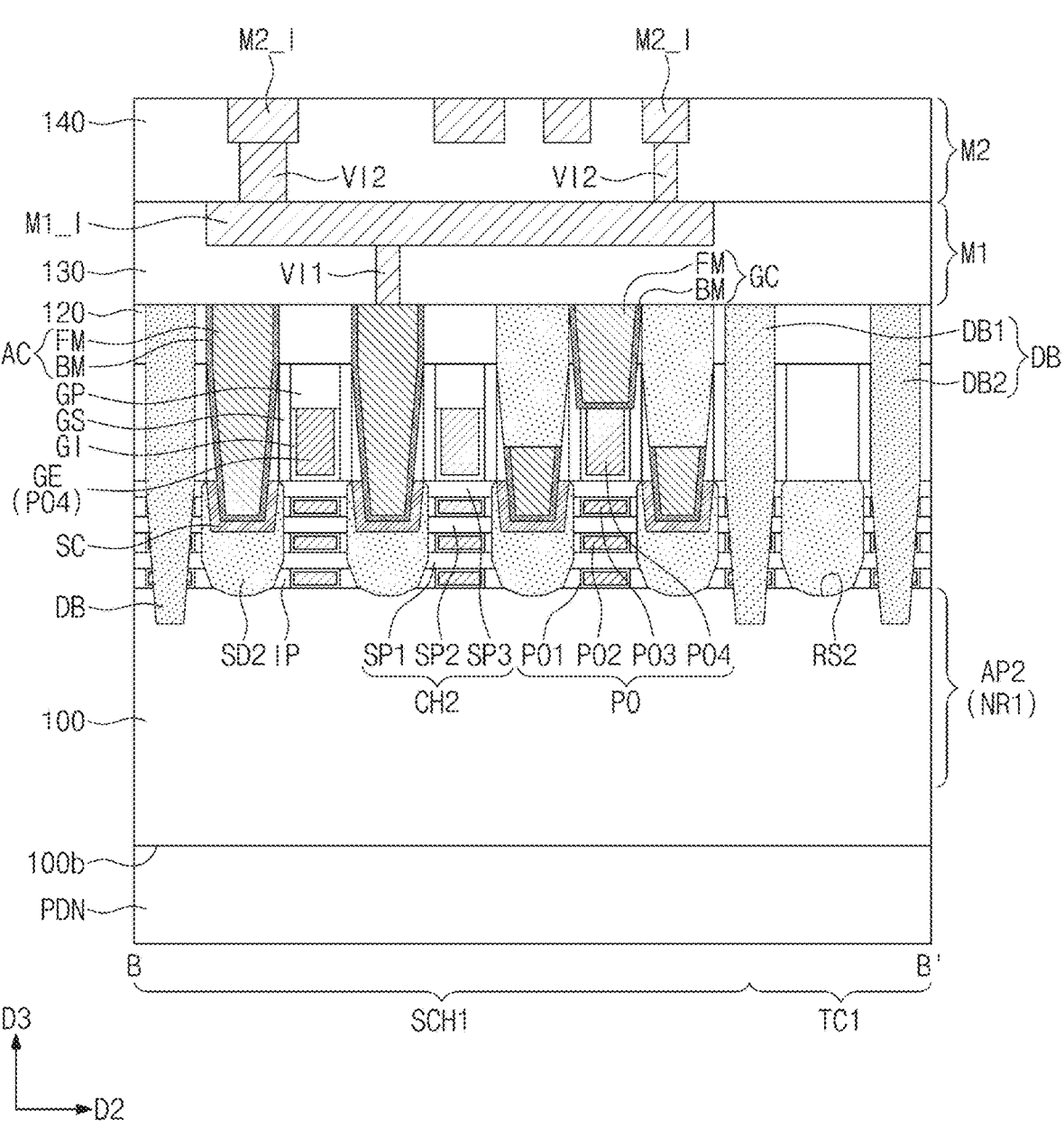
Figure 5C:
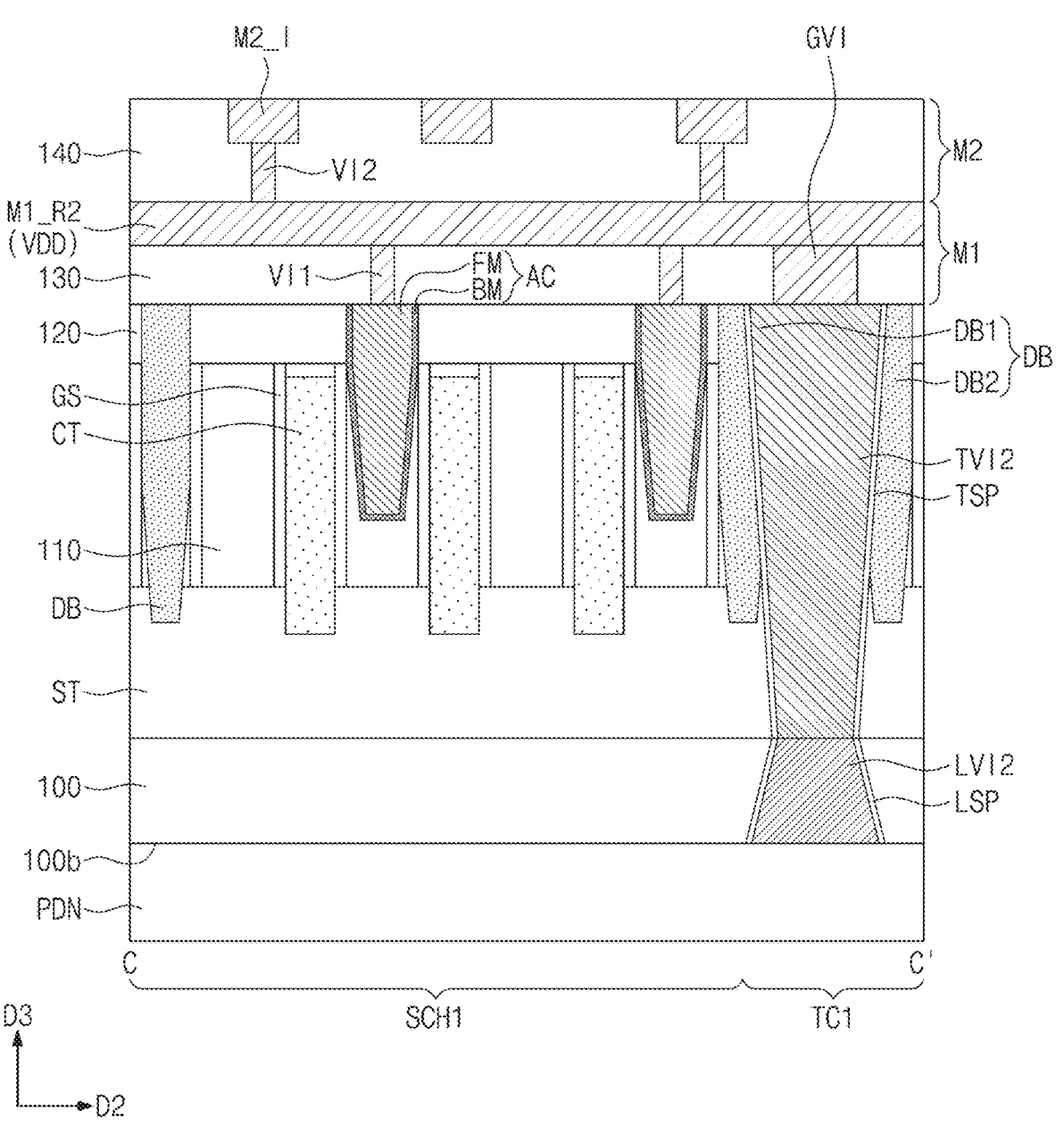
Figure 5D:
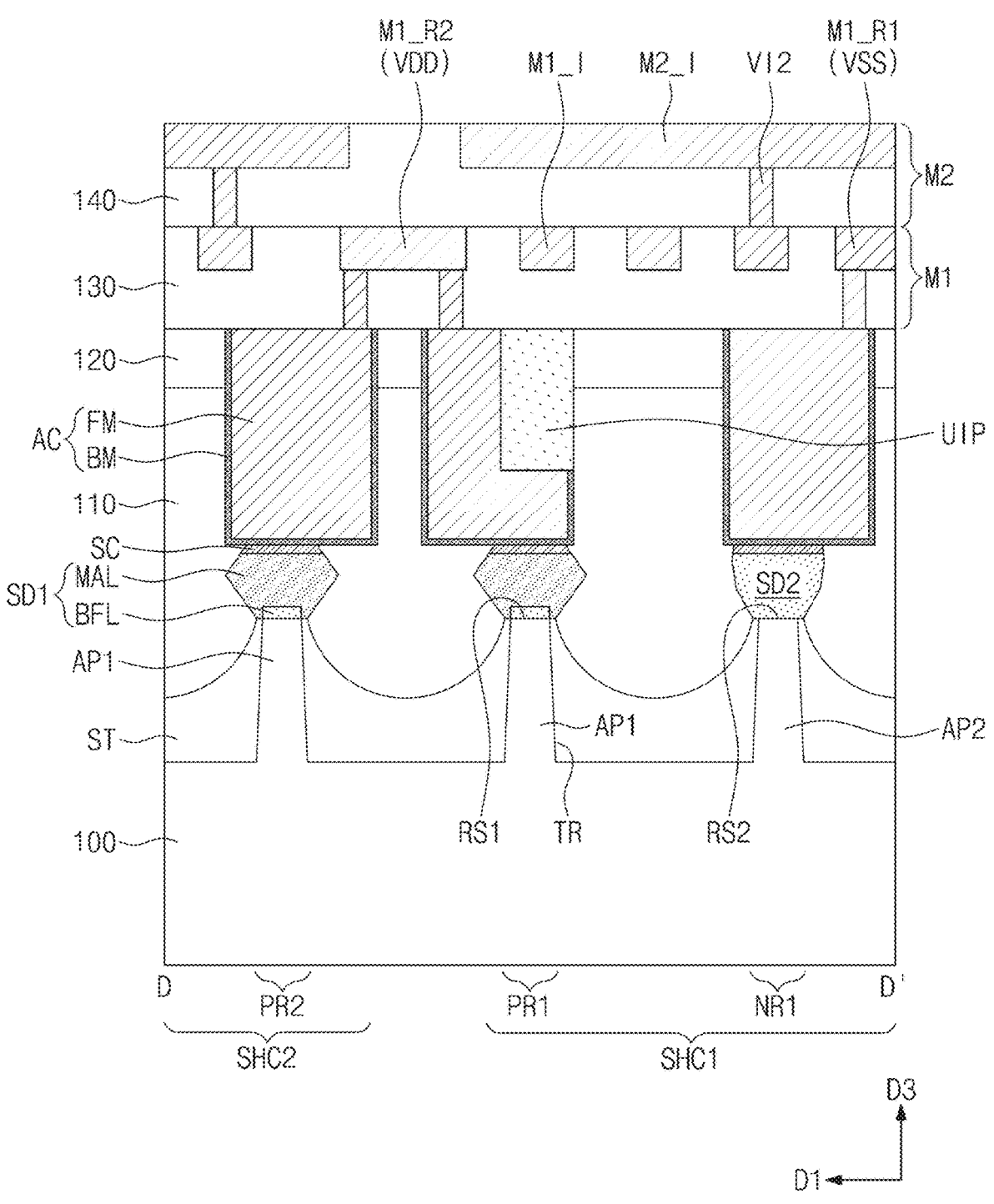
Figure 5E:
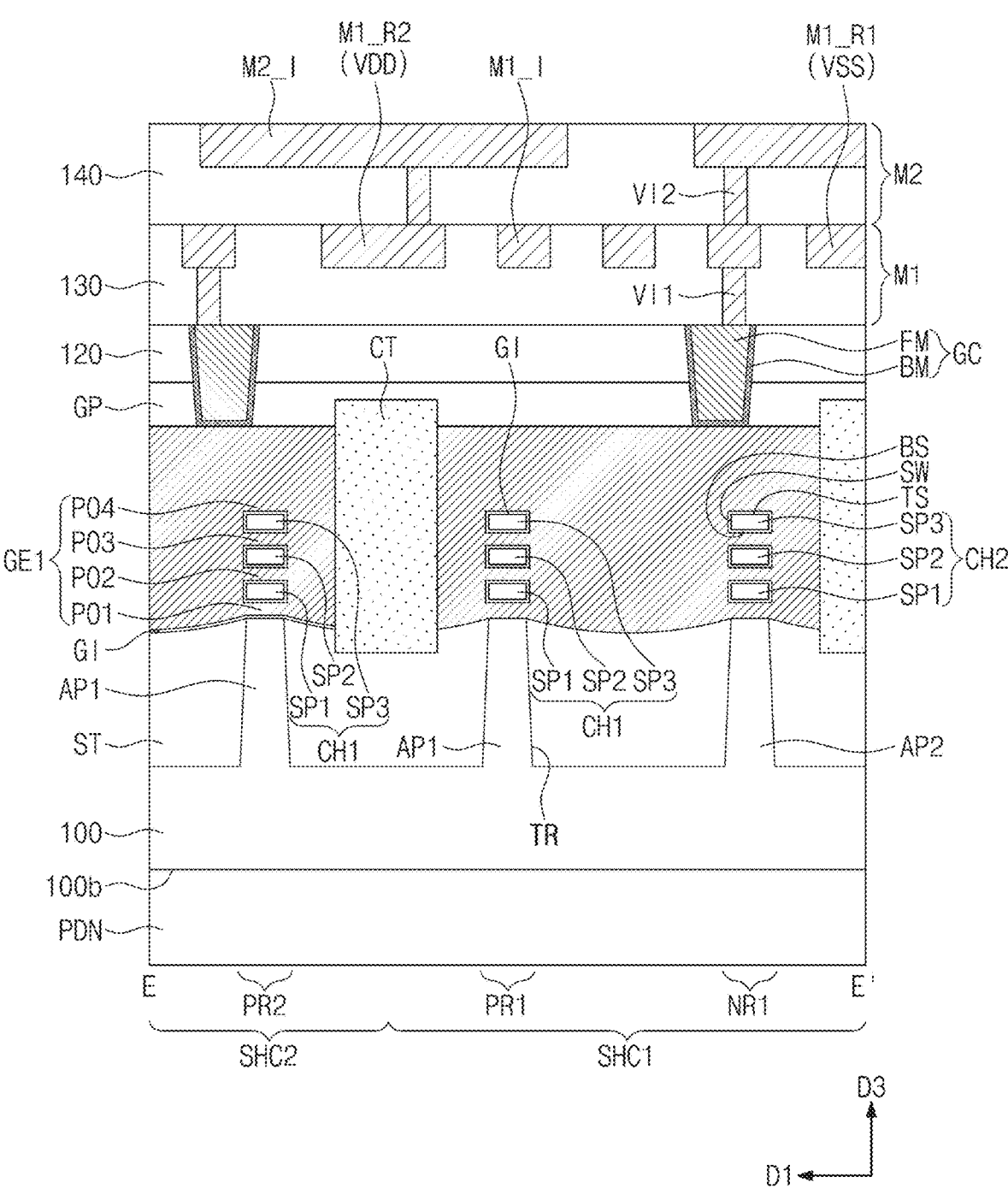
Figure 5F:
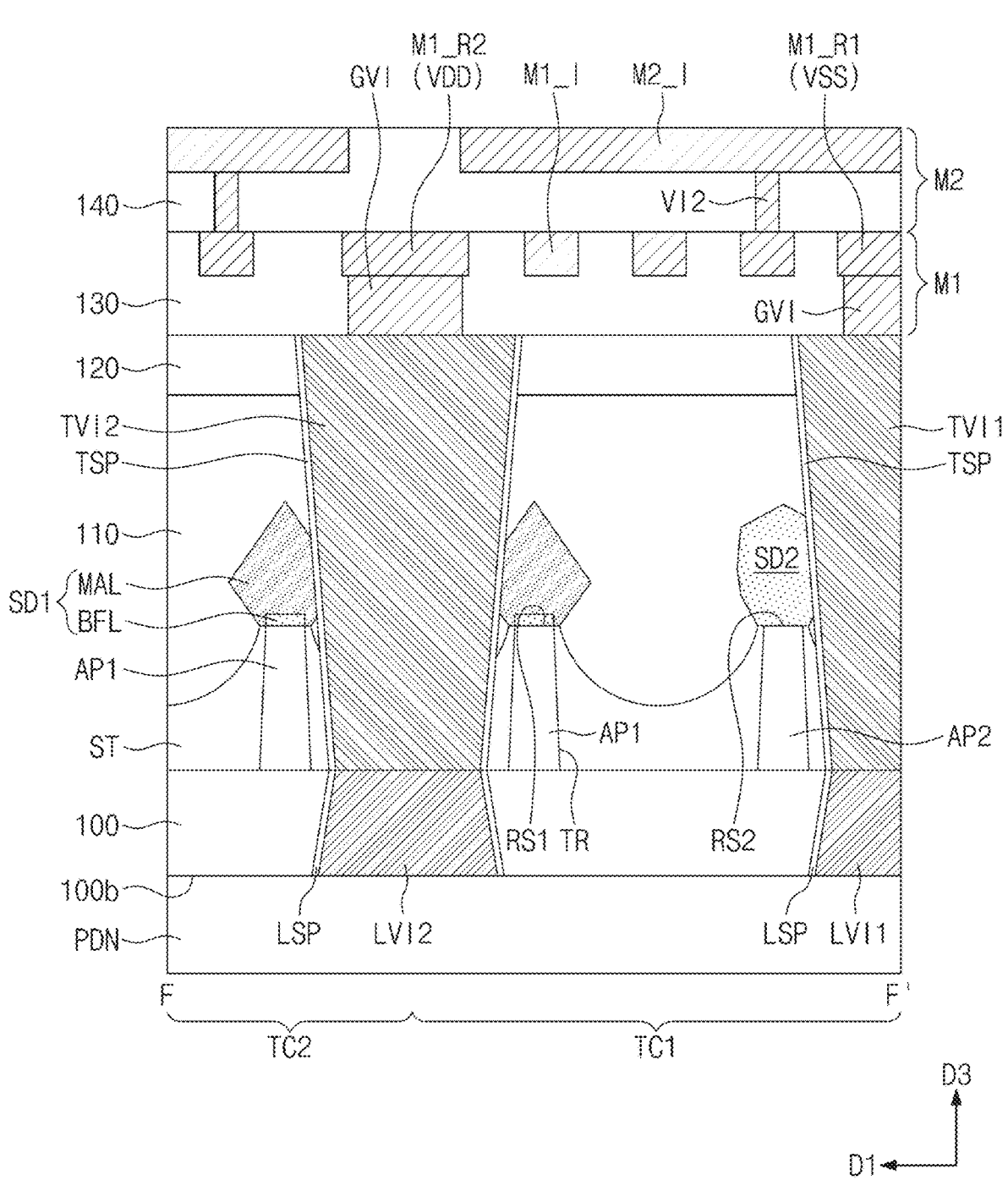

In an embodiment, referring to FIGS. 5A and 5D, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to limit and/or prevent the gate contact GC and the active contact AC, which are adjacent to each other, from being in contact with each other and thereby to limit and/or prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Referring back to FIGS. 4, 5C, and 5F, a first metal layer M1 may be provided in the third interlayer insulating layer 130. The first metal layer M1 may include the first to third power lines M1_R1, M1_R2, and M1_R3.

The first to third power lines M1_R1, M1_R2, and M1_R3 may be extended in the second direction D2 to be parallel to each other. The first power line M1_R1 may be placed on a border of the first single height cell SHC1. The second power line M1_R2 may be placed on a boundary between the first and second single height cells SHC1 and SHC2. The third power line M1_R3 may be placed on a border of the second single height cell SHC2.

Referring back to FIGS. 5C and 5D, the second power line M1_R2 may be electrically connected to at least one active contact AC. A first via VI1 may be provided between the second power line M1_R2 and the at least one active contact AC.

Referring back to FIGS. 4, 5C, and 5F, the first to third penetration vias TVI1, TVI2, and TVI3, which are respectively and electrically connected to the first to third power lines M1_R1, M1_R2, and M1_R3, may be provided on the first and second tab cells TC1 and TC2.

As an example, the second penetration via TVI2 may be vertically extended from the second interlayer insulating layer 120 to the trench TR of the substrate 100. A top surface of the second penetration via TVI2 may be coplanar with a top surface of the second interlayer insulating layer 120. A bottom surface of the second penetration via TVI2 may be coplanar with a bottom surface of the trench TR. A giant via GVI may be provided between the second penetration via TVI2 and the second power line M1_R2. The second penetration via TVI2 and the second power line M1_R2 may be electrically connected to each other through the giant via GVI.

First to third lower penetration vias LVI1, LVI2, and LVI3 may be provided to penetrate the substrate 100. The first to third lower penetration vias LVI1, LVI2, and LVI3 may be connected to the first to third penetration vias TVI1, TVI2, and TVI3, respectively. The first to third lower penetration vias LVI1, LVI2, and LVI3 may be vertically overlapped with the first to third penetration vias TVI1, TVI2, and TVI3, respectively.

As an example, the second lower penetration via LVI2 may be vertically extended from a bottom surface 100b of the substrate 100 to the bottom surface of the second penetration via TVI2. A top surface of the second lower penetration via LVI2 may be in contact with the bottom surface of the second penetration via TVI2.

In an embodiment, the penetration via TVI1-TVI3 and the lower penetration via LVI1-LVI3 may be formed of or include the same metal. For example, the penetration via TVI1-TVI3 and the lower penetration via LVI1-LVI3 may be formed of or include copper.

In another embodiment, the penetration via TVI1-TVI3 and the lower penetration via LVI1-LVI3 may be formed of or include different metallic materials. For example, the penetration via TVI1-TVI3 may be formed of or include molybdenum or ruthenium, and the lower penetration via LVI1-LVI3 may be formed of or include copper.

The penetration via TVI1-TVI3 and the lower penetration via LVI1-LVI3 may be self-aligned to each other. For example, a center line of the penetration via TVI1-TVI3 and a center line of the lower penetration via LVI1-LVI3 may be aligned to each other.

As a height in the third direction D3 increases, a width of the penetration via TVI1-TVI3 may increase. That is, as a distance to the bottom surface 100b of the substrate 100 decreases, the width of the penetration via TVI1-TVI3 may decrease. As a distance to the bottom surface 100b of the substrate 100 decreases, a width of the lower penetration via LVI1-LVI3 may increase. Thus, the penetration via TVI1-TVI3 and the lower penetration via LVI1-LVI3 may form a sandglass-shaped structure.

An upper spacer TSP may be provided on a side surface of the penetration via TVI1-TVI3. The upper spacer TSP may be formed of or include at least one of silicon-based insulating materials (e.g., silicon oxide, silicon nitride, or silicon oxynitride). A lower spacer LSP may be provided on a side surface of the lower penetration via LVI1-LVI3. The lower spacer LSP may be formed of or include at least one of silicon-based insulating materials (e.g., silicon oxide, silicon nitride, or silicon oxynitride).

A power delivery network layer PDN may be provided on the bottom surface 100b of the substrate 100. The power delivery network layer PDN may include a plurality of lower interconnection lines, which are electrically connected to the first to third lower penetration vias LVI1, LVI2, and LVI3. In other words, the power delivery network layer PDN may be electrically connected to the first to third power lines M1_R1, M1_R2, and M1_R3.

In an embodiment, the power delivery network layer PDN may include an interconnection network, which is used to apply the source voltage VSS to the first and third power lines M1_R1 and M1_R3. The power delivery network layer PDN may include an interconnection network, which is used to apply the drain voltage VDD to the second power line M1_R2.

Referring back to FIG. 4 and FIGS. 5A to 5F, the first metal layer M1 may further include first interconnection lines MU. The first interconnection lines M1_I may be extended in the second direction D2 to be parallel to each other.

The first metal layer M1 may further include the first vias VI1. The first vias VI1 may be respectively provided below the first interconnection lines M1_I of the first metal layer M1. The active contact AC and the first interconnection line M1_I may be electrically connected to each other through the first via VI1. The gate contact GC and the first interconnection line M1_I may be electrically connected to each other through the first via VI1.

The first interconnection line M1_I of the first metal layer M1 and the first via VI1 thereunder may be separately formed by different processes. That is, each of the first interconnection line M1_I and the first via VI1 of the first metal layer M1 may be formed by a single damascene process. The semiconductor device according to the present embodiment may be fabricated using a sub-20 nm process.

A second metal layer M2 may be provided in a fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 to be parallel to each other.

The second metal layer M2 may further include second vias VI2, which are respectively provided below the second interconnection lines M2_I. The first interconnection line M1_I of the first metal layer M1 and the second interconnection line M2_I of the second metal layer M2 may be electrically connected to each other through the second via VI2. As an example, the second interconnection line M2_I of the second metal layer M2 and the second via VI2 thereunder may be formed by a dual damascene process.

The first interconnection line M1_I of the first metal layer M1 and the second interconnection line M2_I of the second metal layer M2 may be formed of or include the same conductive material or different conductive materials. For example, the first interconnection line M1_I of the first metal layer M1 and the second interconnection line M2_I of the second metal layer M2 may be formed of or include at least one of metallic materials (e.g., aluminum, copper, tungsten, molybdenum, ruthenium, and cobalt). Although not shown, a plurality of metal layers (e.g., M3, M4, M5, and so forth)

may be additionally stacked on the fourth interlayer insulating layer 140. Each of the stacked metal layers may include interconnection lines, which are used as routing paths between cells.

According to an embodiment of inventive concepts, the penetration via TVI1-TVI3 and the lower penetration via LVI1-LVI3 may be separately formed through at least two different processes. That is, vertical contacts, which are extended from the power delivery network layer PDN to the first metal layer M1, may include two separate groups (e.g., the penetration via TVI1-TVI3 and the lower penetration via LVI1-LVI3), which are independently formed. As a result, it may be possible to improve a filling property in a metal-filling step, which is performed to form the vertical contacts (e.g., TVI and LVI) having a high aspect ratio, and thereby to improve reliability characteristics of the semiconductor device.

The penetration via TVI and the lower penetration via LVI of the vertical contacts TVI and LVI may be separately on the top and bottom surfaces of the substrate 100. Thus, it may be possible to reduce a chip area for the vertical contacts. Hence, a size of a tab cell may be reduced, as will be described below.

According to an embodiment of inventive concepts, the tab cell TC1 or TC2 may be provided to have a size corresponding to the first pitch, which is a distance between the gate electrodes GE. That is, according to an embodiment of inventive concepts, the tab cell TC1 or TC2 may have a very small size. As the size of the tab cell TC1 or TC2 decreases, an area of logic cells, which are disposed in a logic die, may be increased. As a result, it may be possible to increase an integration density of the semiconductor device.

Figure 12:
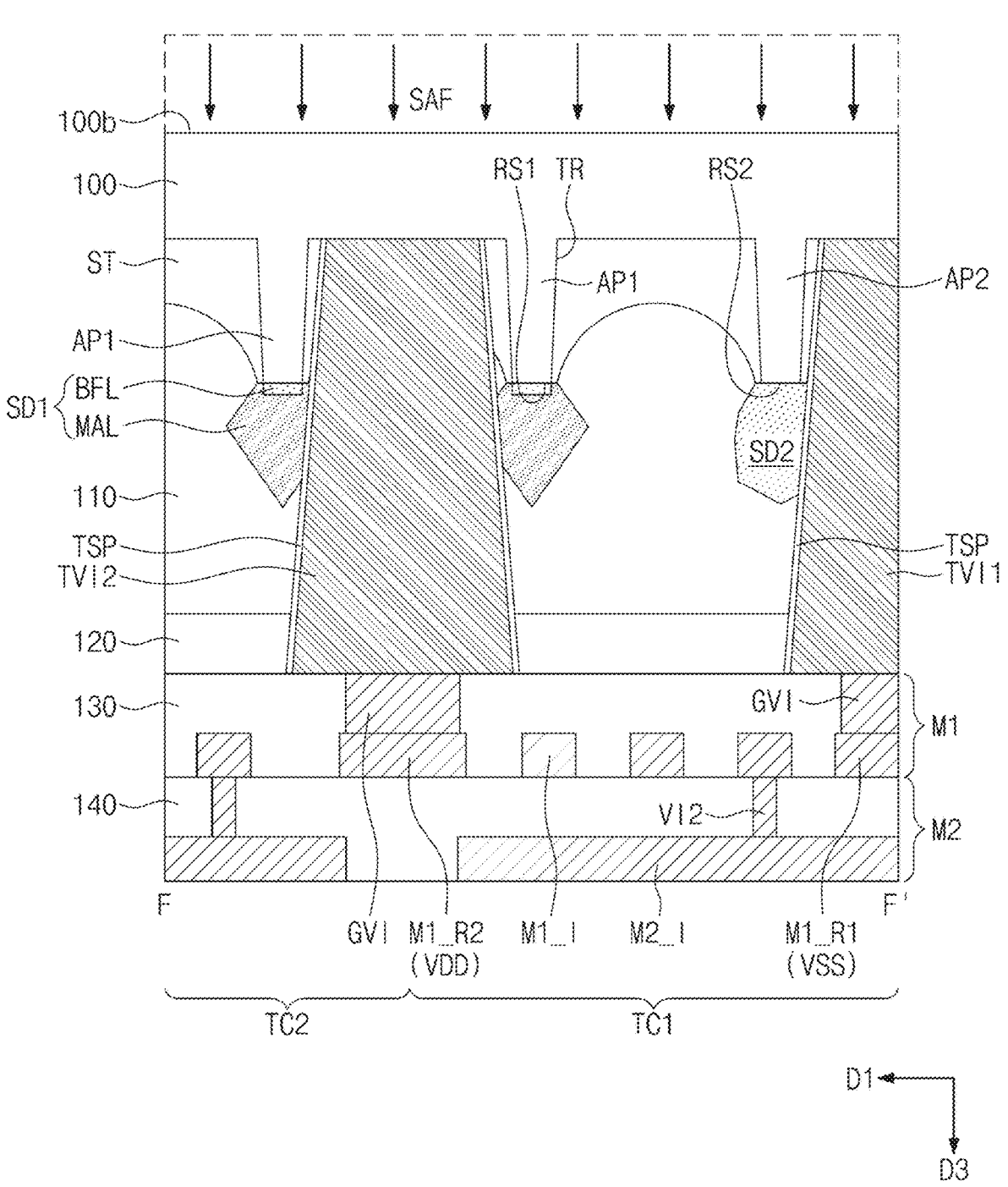
Figure 13:
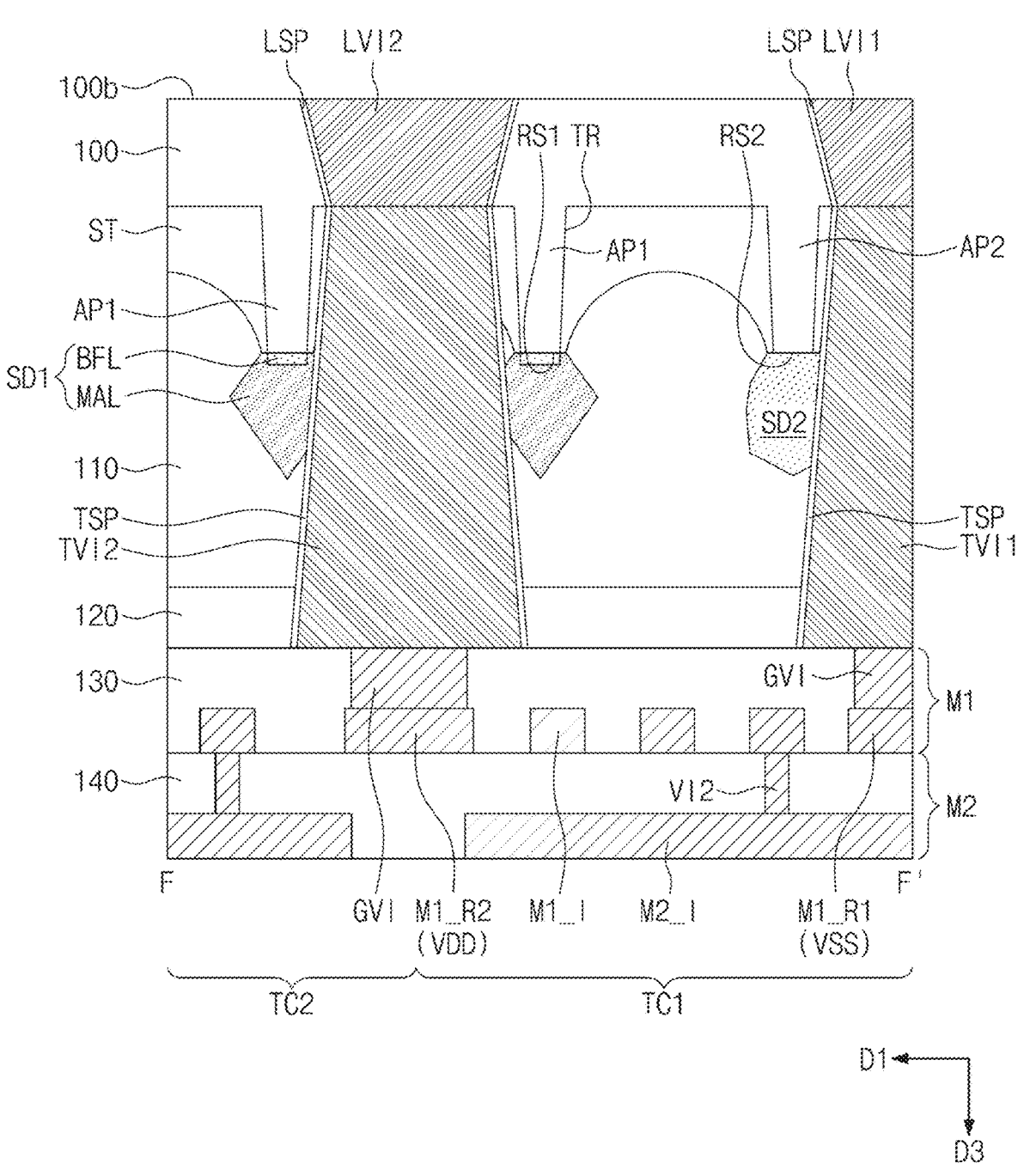

FIGS. 6A to 13 are sectional views illustrating a method of fabricating a semiconductor device, according to an embodiment of inventive concepts. In detail, FIGS. 6A, 7A, 8A, 9A, 10A, and 11A are sectional views corresponding to the line A-A' of FIG. 4. FIGS. 8B, 9B, 10B, and 11B are sectional views corresponding to the line B-B' of FIG. 4. FIGS. 8C and 9C are sectional views corresponding to the line D-D' of FIG. 4. FIGS. 6B, 7B, 10C, and 11C are sectional views corresponding to the line E-E' of FIG. 4. FIGS. 11D, 12, and 13 are sectional views corresponding to the line F-F of FIG. 4.

Figure 6A:
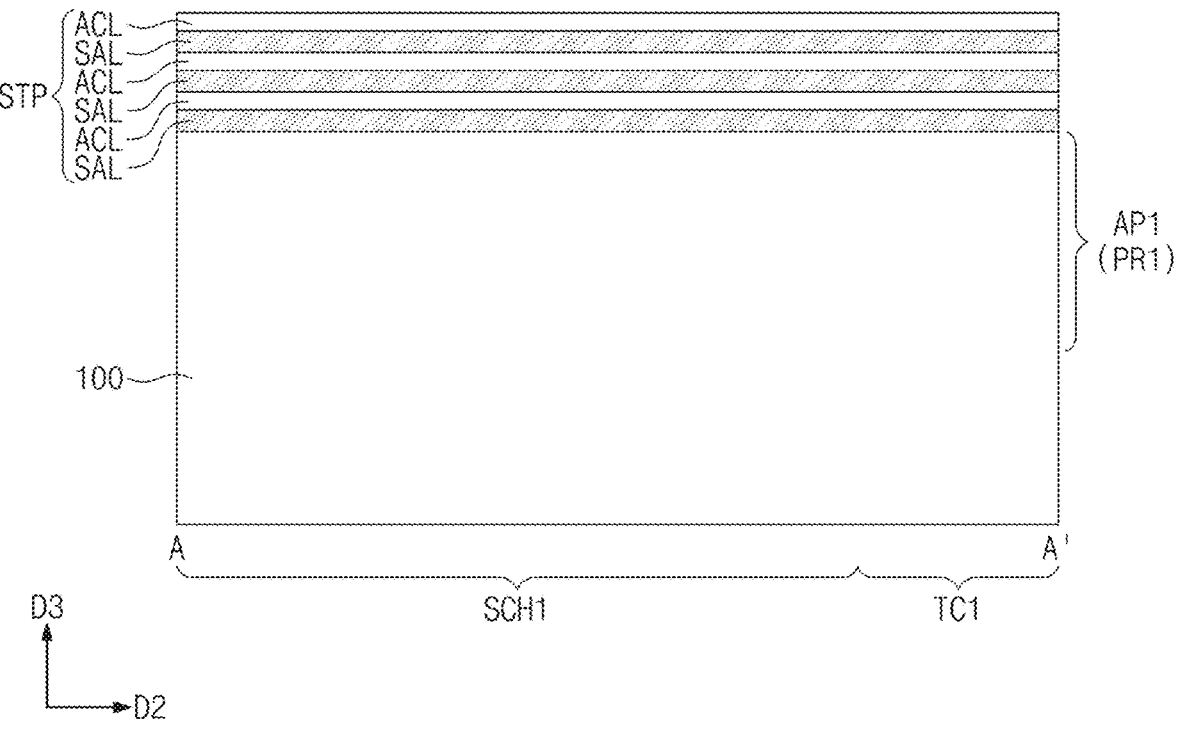
FIGS. 6A to 13 are sectional views illustrating a method of fabricating a semiconductor device, according to an embodiment of inventive concepts.
Figure 6B:
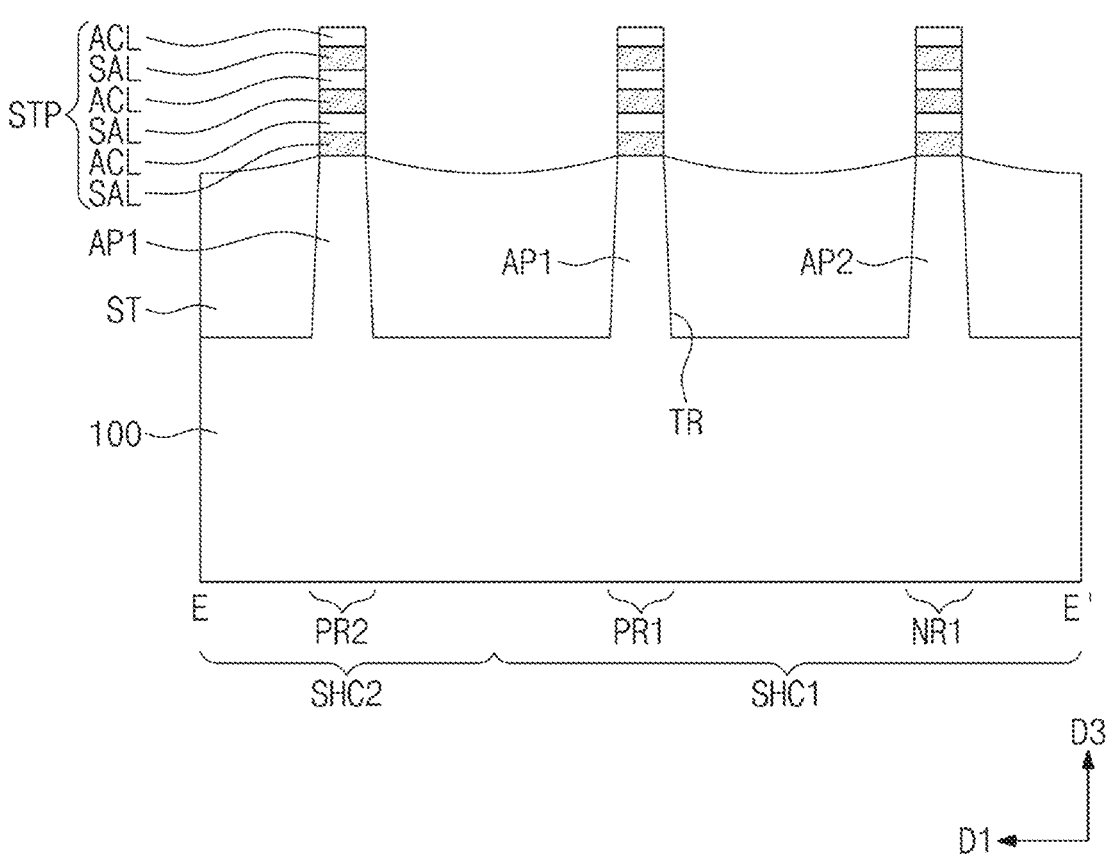

Referring to FIGS. 6A and 6B, the substrate 100 including the first and second PMOSFET regions PR1 and PR2 and the first and second NMOSFET regions NR1 and NR2 may be provided. First and second semiconductor layers ACL and SAL, which are alternately stacked on the substrate 100, may be formed. Each of the first and second semiconductor layers ACL and SAL may be formed of or include at least one of silicon (Si), germanium (Ge), or silicon-germanium (SiGe), but the first and second semiconductor layers ACL and SAL may be formed of different materials from each other.

The second semiconductor layer SAL may be formed of or include a material that is chosen to have an etch selectivity with respect to the first semiconductor layer ACL. For example, the first semiconductor layers ACL may be formed of or include silicon (Si), and the second semiconductor layers SAL may be formed of or include silicon-germanium (SiGe). A germanium concentration of each of the second semiconductor layers SAL may range from 10 at % to 30 at %.

Mask patterns may be respectively formed on the first and second PMOSFET regions PR1 and PR2 and the first and second NMOSFET regions NR1 and NR2 of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOS-FET regions NR1 and NR2. When viewed in a plan view, the first and second active patterns AP1 and AP2 may be line-shaped patterns, which are extended in the second direction D2 to be parallel to each other.

A stacking pattern STP may be formed on each of the first and second active patterns AP1 and AP2. The stacking pattern STP may include the first semiconductor layers ACL and the second semiconductor layers SAL, which are alternately stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer until the stacking patterns STP are exposed.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 7A:
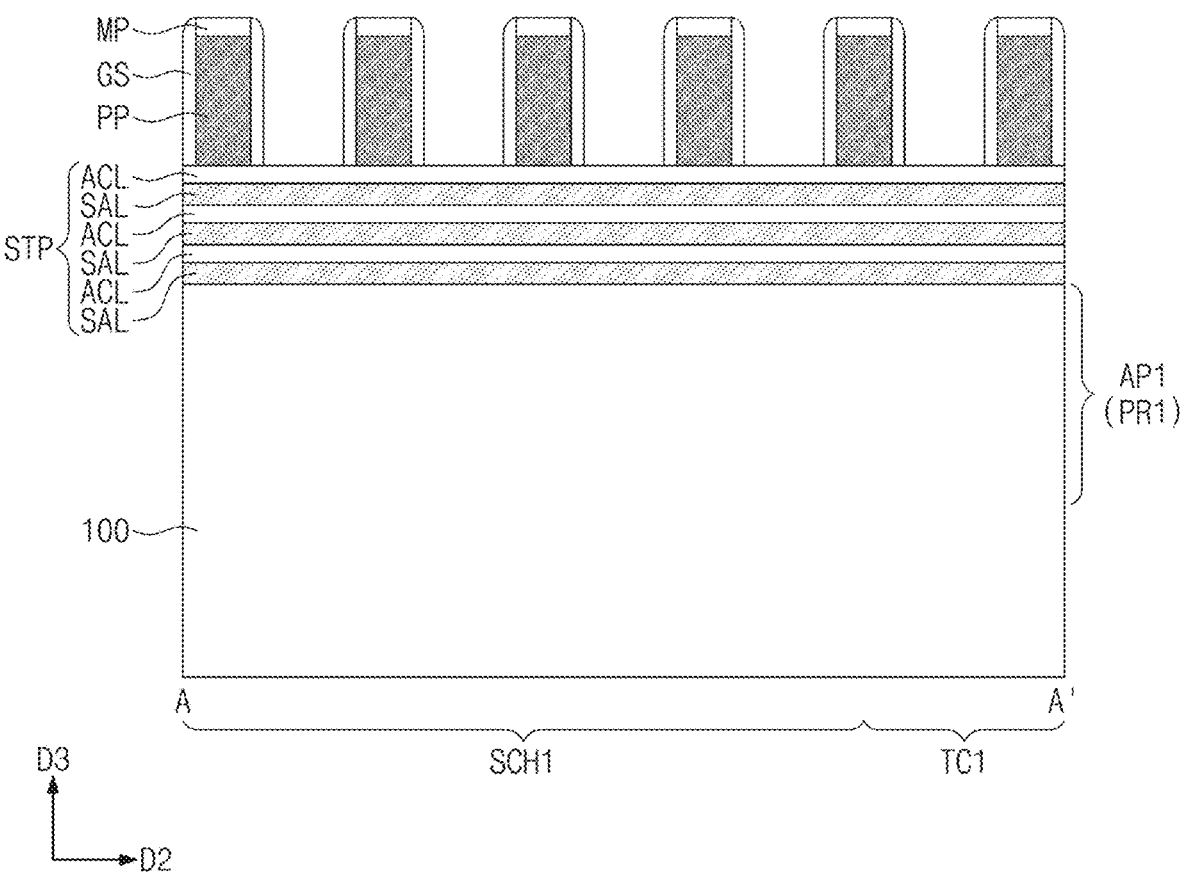
Figure 7B:
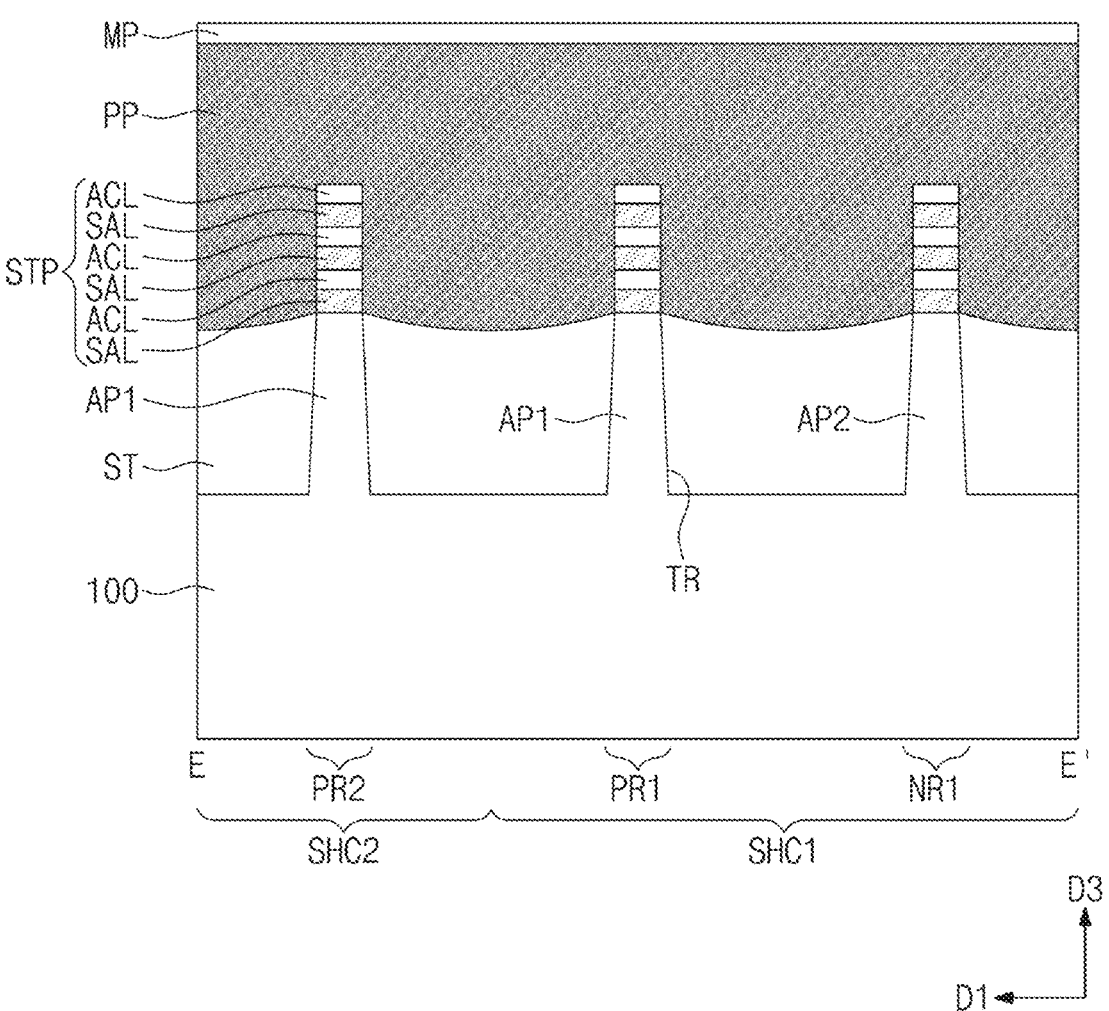

Referring to FIGS. 7A and 7B, sacrificial patterns PP may be formed on the substrate 100 to cross the stacking patterns STP. Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and aniso-tropically etching the gate spacer layer. The gate spacer layer may be formed of or include at least one of SiCN, SiCON, or SiN. In an embodiment, the gate spacer layer may be a multi-layered structure including at least two of SiCN, SiCON, or SiN.

Figure 8A:
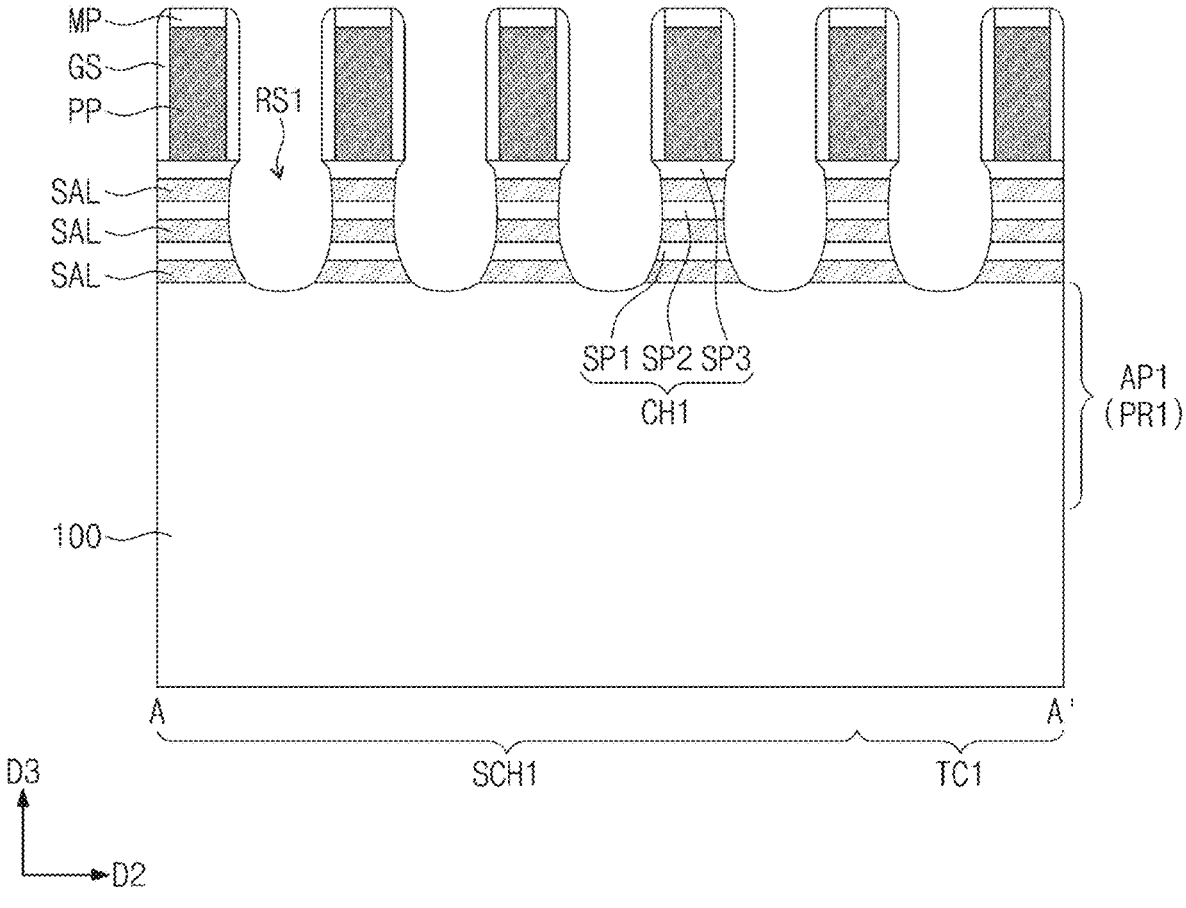
Figure 8B:
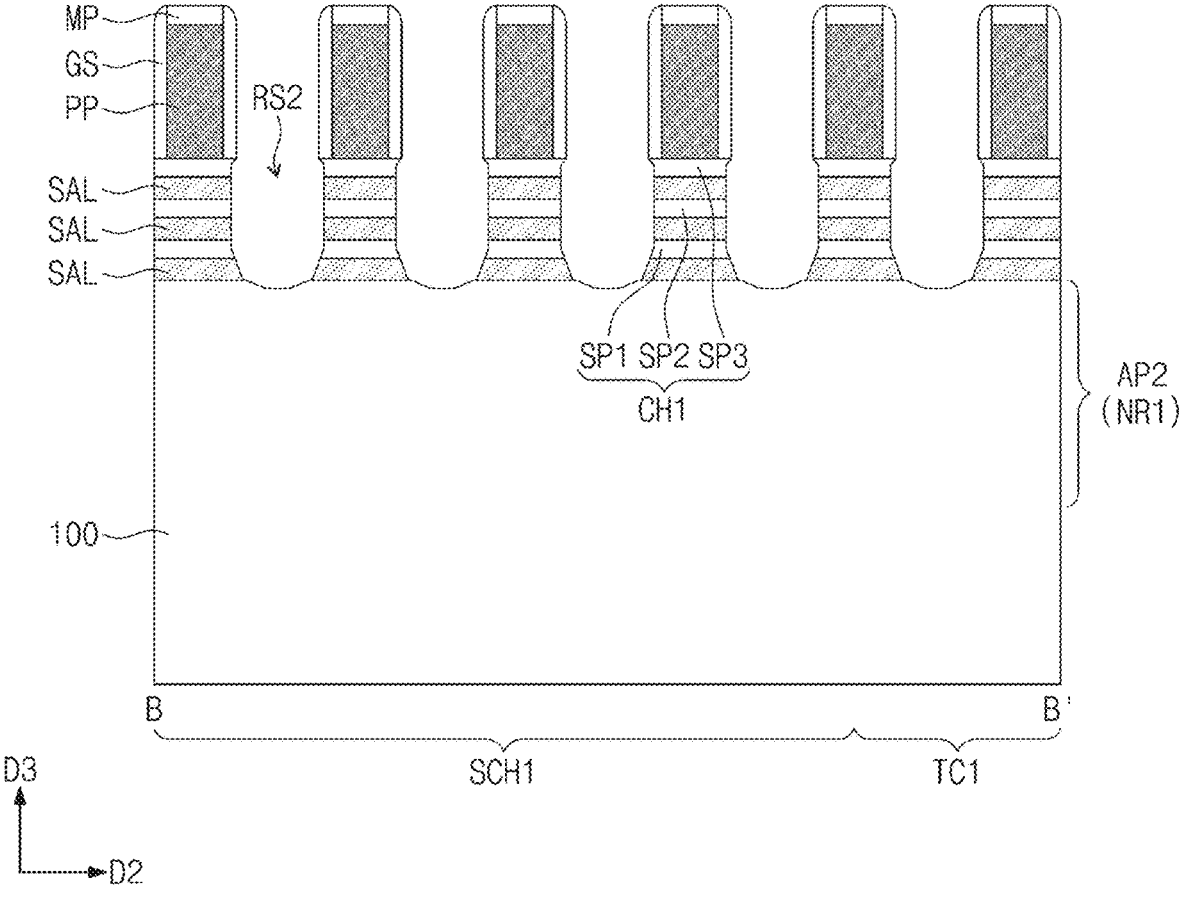
Figure 8C:
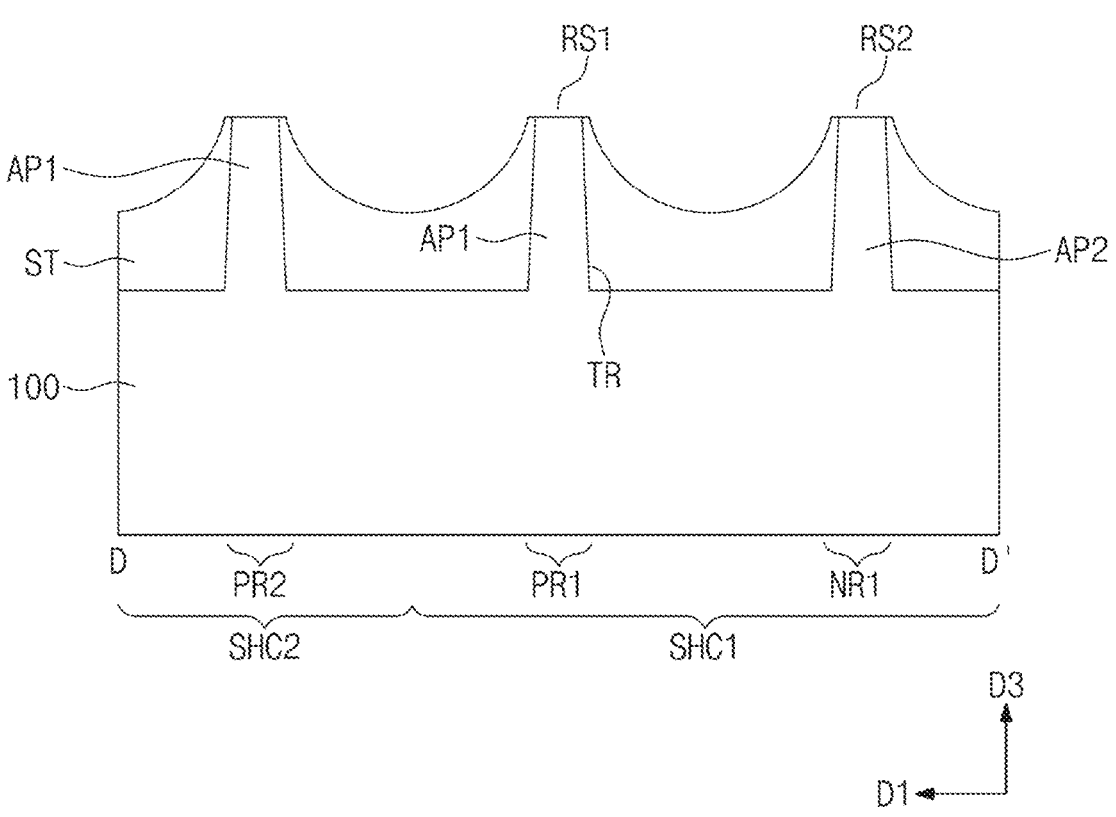

Referring to FIGS. 8A to 8C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 8C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP. The second recesses RS2 in the stacking pattern STP on the second active pattern AP2 may be formed by the same method as that for the first recesses RS1.

The first to third semiconductor patterns SP1, SP2, and SP3, which are sequentially stacked between adjacent ones of the first recesses RS1, may be formed from the first semiconductor layers ACL, respectively. The first to third semiconductor patterns SP1, SP2, and SP3, which are sequentially stacked between adjacent ones of the second recesses RS2, may be formed from the first semiconductor layers ACL, respectively. The first to third semiconductor patterns SP1, SP2, and SP3 between adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

Figure 9A:
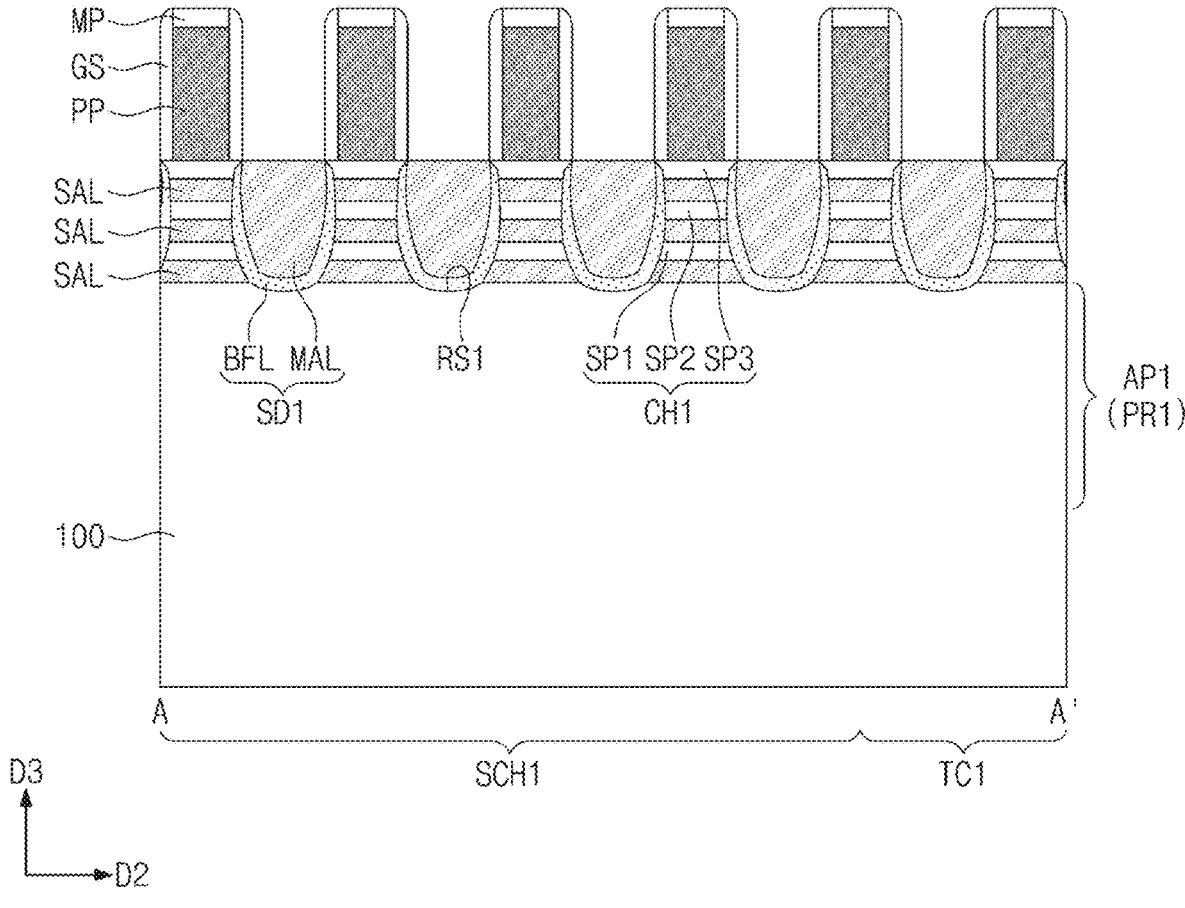
Figure 9B:
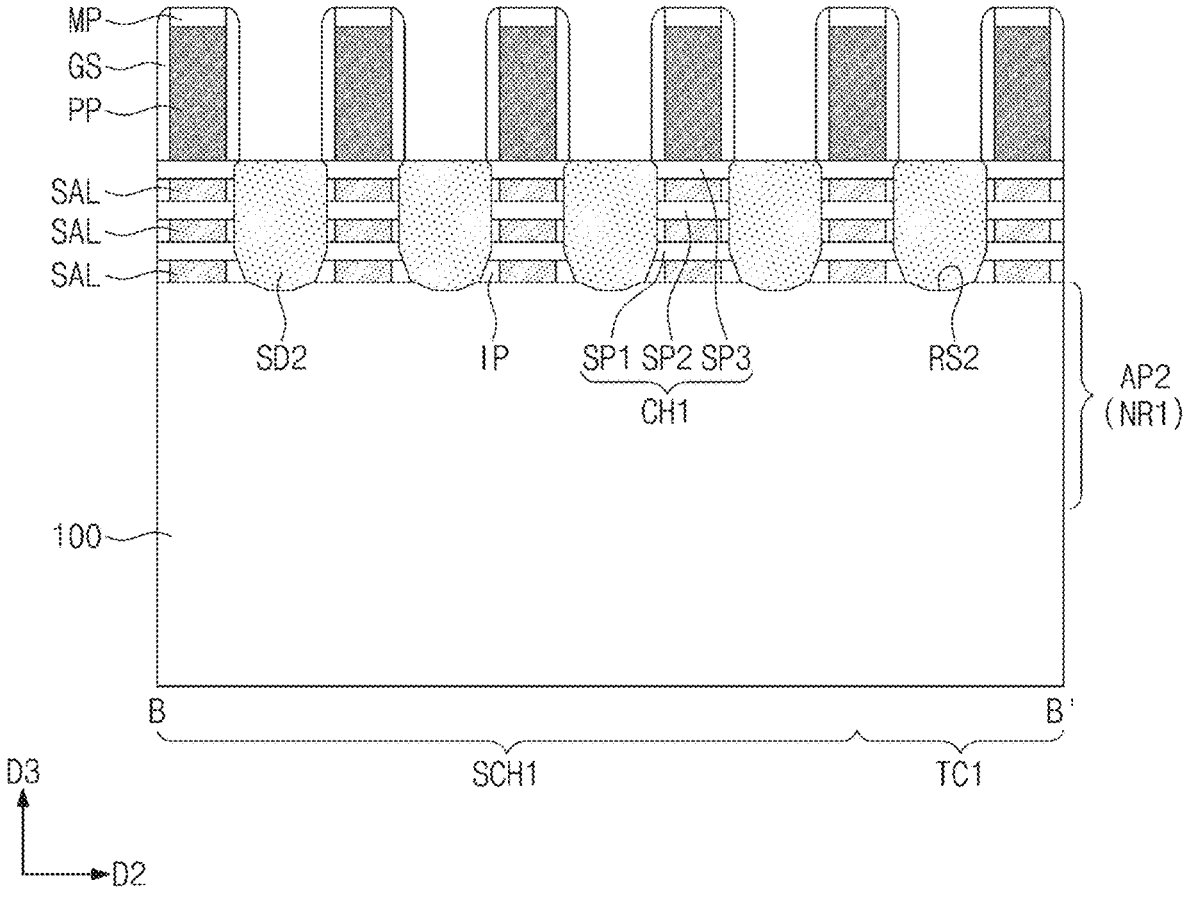
Figure 9C:
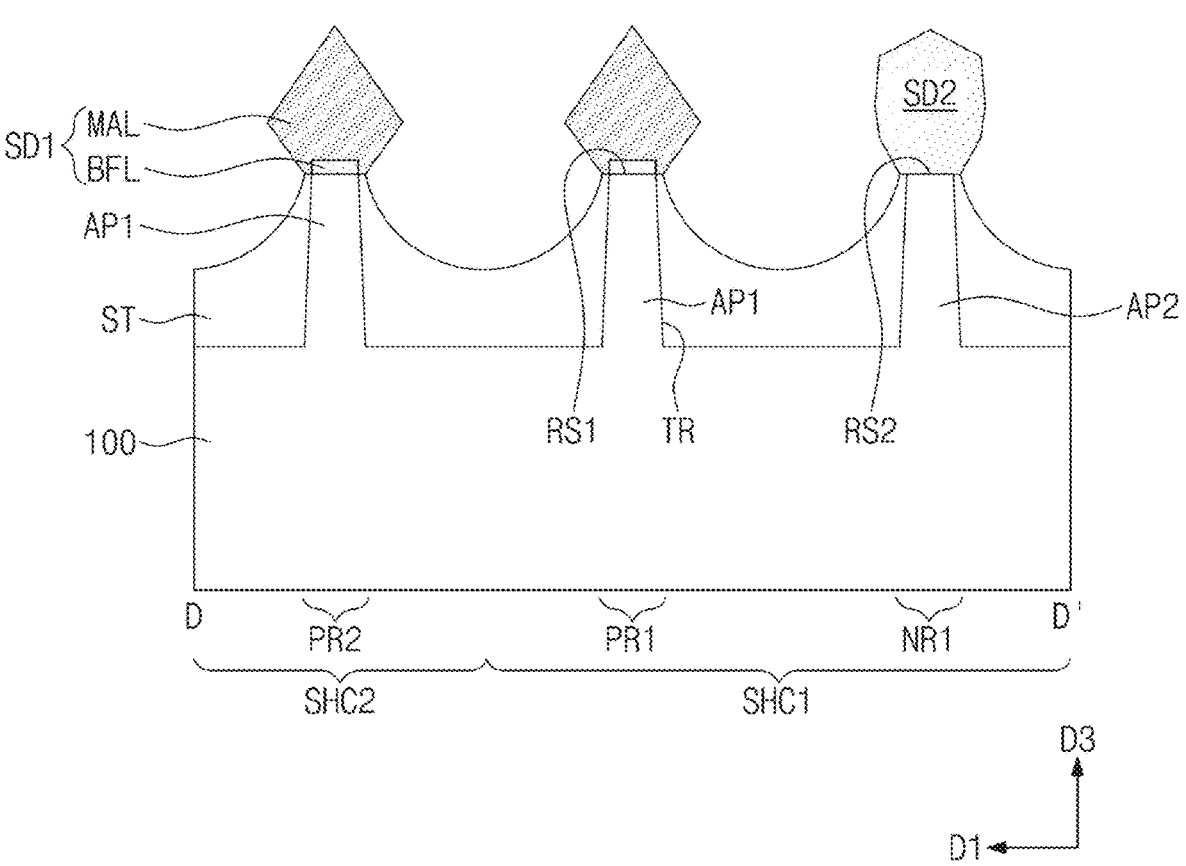

Referring to FIGS. 9A to 9C, the first source/drain patterns SD1 may be formed in the first recesses RS1, respectively. In detail, the buffer layer BFL may be formed by a first SEG process using an inner surface of the first recess RS1 as a seed layer. The buffer layer BFL may be grown using the first to third semiconductor patterns SP1, SP2, and SP3 and the substrate 100, which are exposed through the first recess RS1, as a seed layer. As an example, the first SEG process may include a chemical vapor deposition (CVD) process or a molecular beam epitaxy (MBE) process.

The buffer layer BFL may contain a semiconductor material (e.g., SiGe) whose lattice constant is larger than that of a semiconductor material of the substrate 100. The buffer layer BFL may contain a relatively low concentration of germanium (Ge). In another embodiment, the buffer layer BFL may contain only silicon (Si), without germanium (Ge). A germanium concentration of the buffer layer BFL may range from 0 at % to 10 at %.

A second SEG process may be performed on the buffer layer BFL to form the main layer MAL. The main layer MAL may be formed to completely or nearly completely fill the first recess RS1. The main layer MAL may contain a relatively high concentration of germanium. As an example, a germanium concentration of the main layer MAL may range from 30 at % to 70 at %.

In an embodiment, a third SEG process may be performed on the main layer MAL to form a capping layer. The capping layer may be formed of or include silicon (Si). A silicon concentration of the capping layer may range from 98 at % to 100 at %.

The first source/drain pattern SD1 may be doped in-situ with p-type impurities (e.g., boron, gallium, or indium) during the formation of the buffer and main layers BFL and MAL. Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a SEG process, in which an inner surface of the second recess RS2 is used as a seed layer. In an embodiment, the second source/drain pattern SD2 may be formed of or include the same semiconductor material (e.g., Si) as the substrate 100.

During the formation of the second source/drain pattern SD2, the second source/drain pattern SD2 may be doped in-situ with n-type impurities (e.g., phosphorus, arsenic, or antimony). Alternatively, impurities may be injected into the second source/drain pattern SD2, after the formation of the second source/drain pattern SD2.

In an embodiment, before the formation of the second source/drain pattern SD2, the inner spacer IP may be formed by replacing a portion of the second semiconductor layer SAL, which is exposed by the second recess RS2, with an insulating material. As a result, the inner spacers IP may be respectively formed between the second source/drain pattern SD2 and the second semiconductor layers SAL.

Figure 10A:
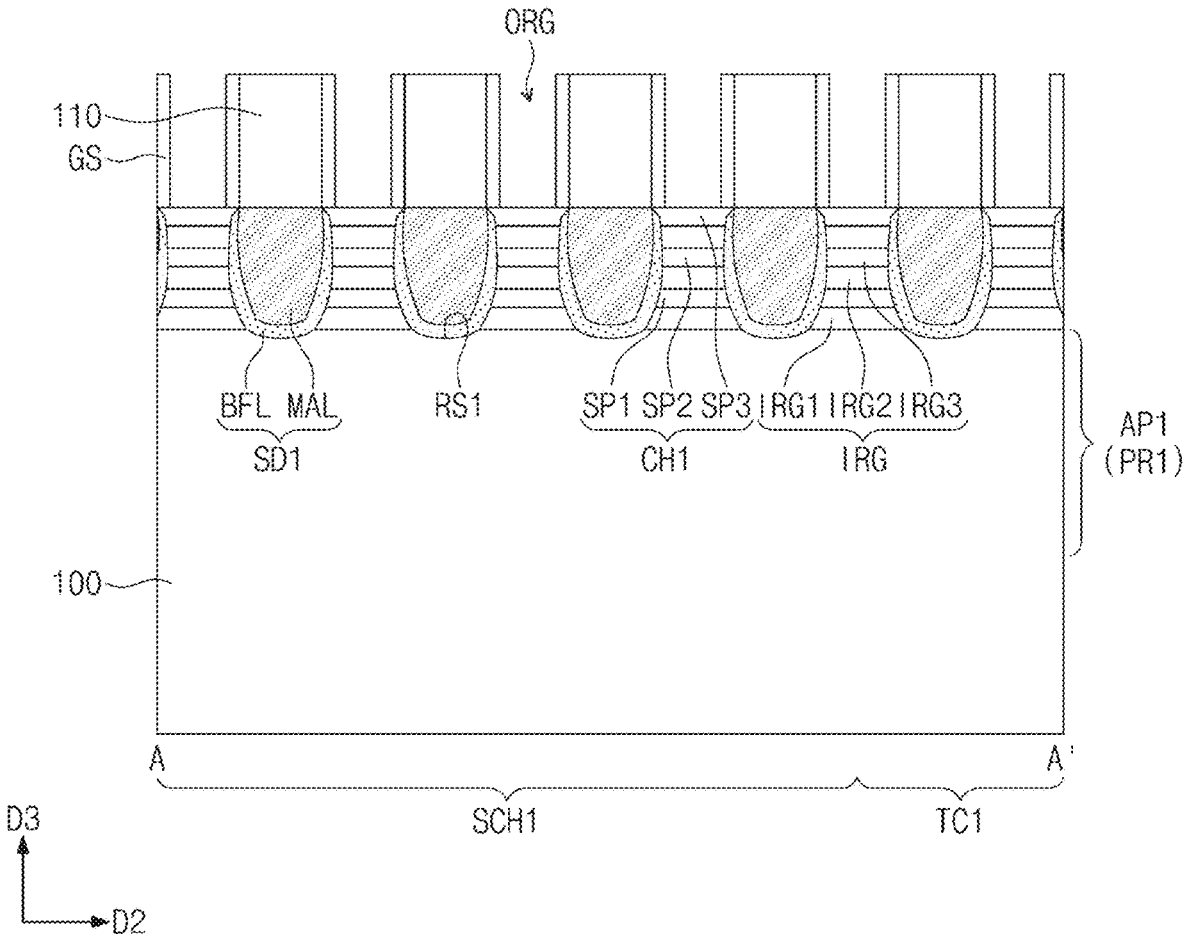
Figure 10B:
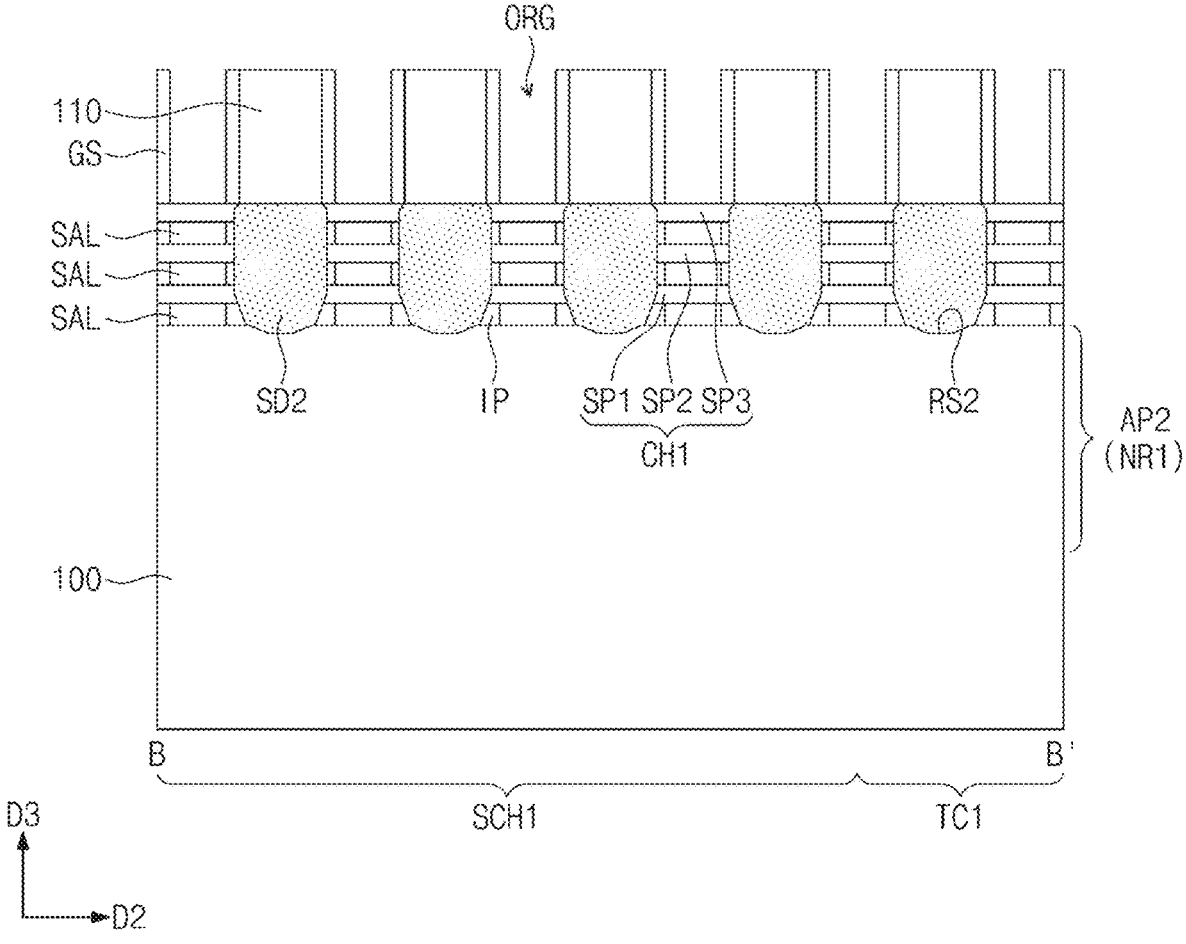
Figure 10C:
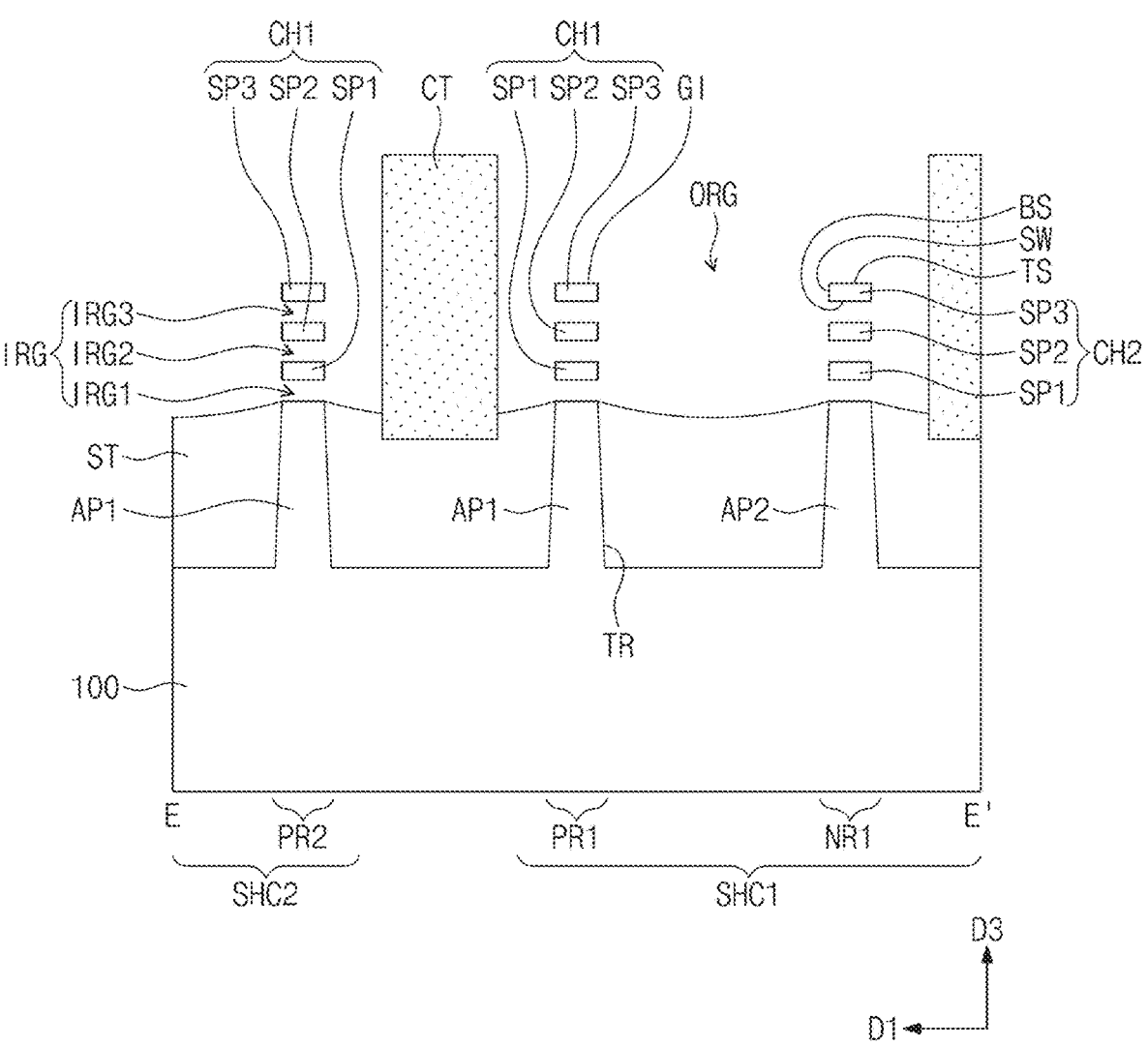
Figure 11A:
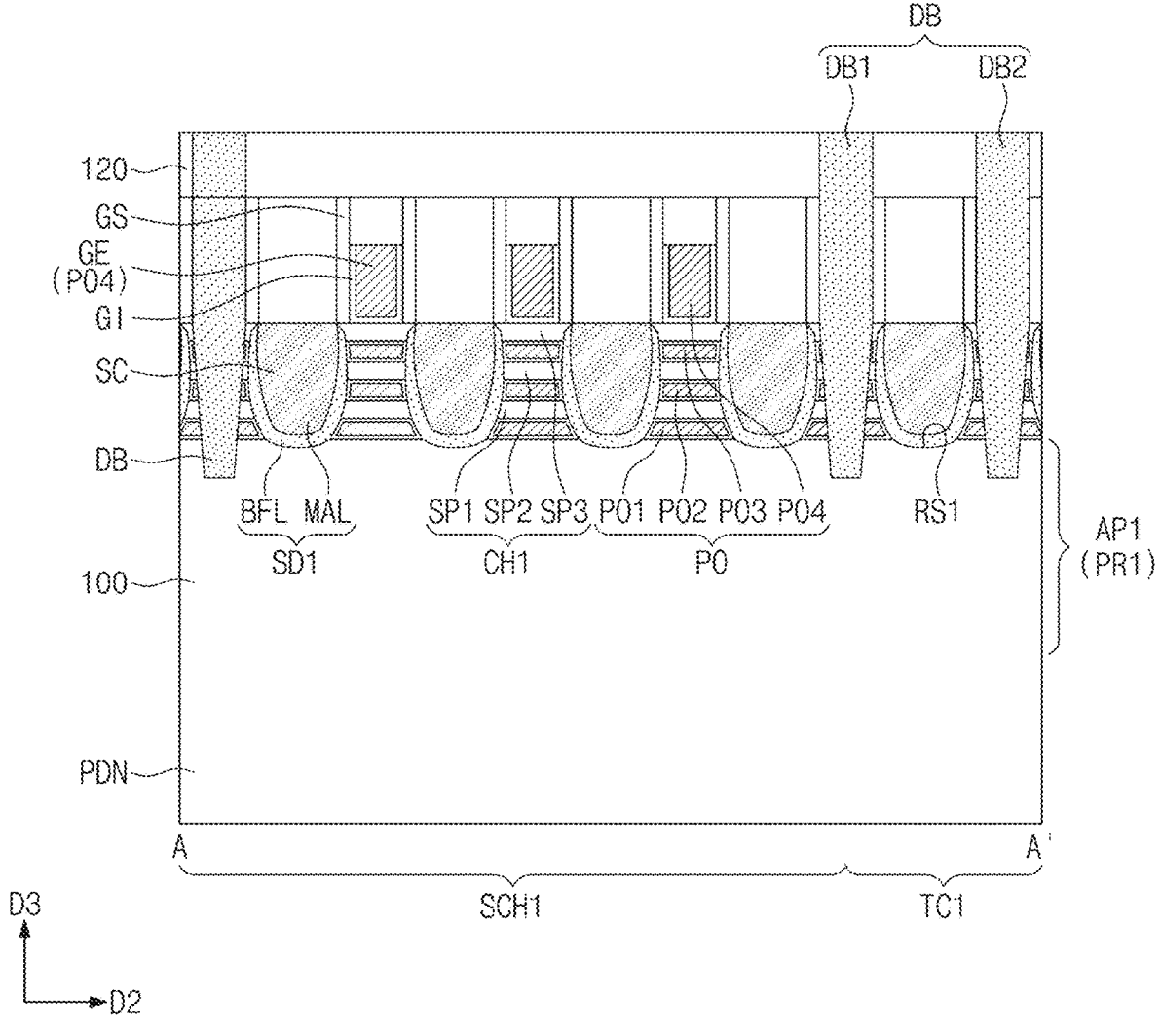
Figure 11B:
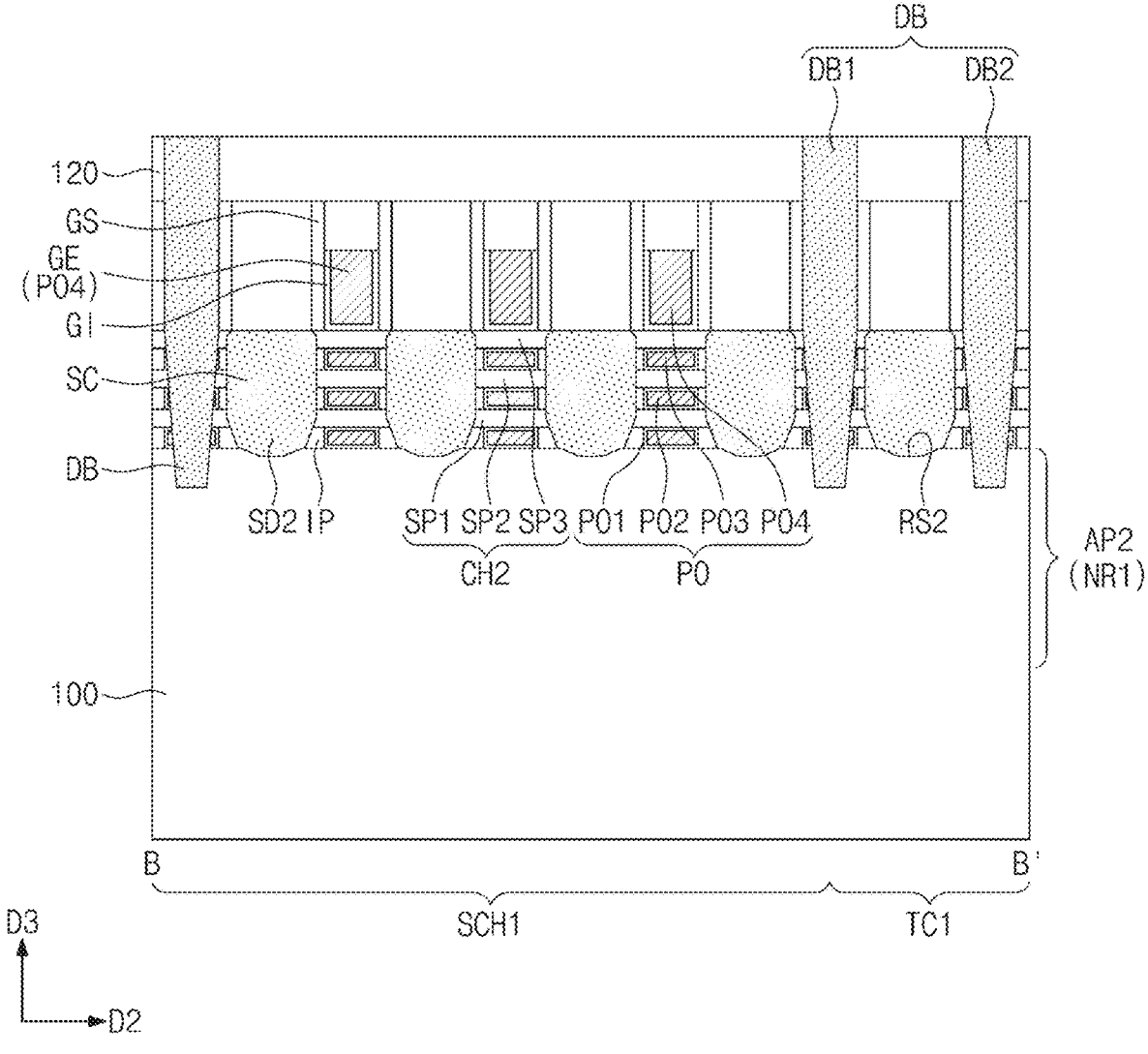
Figure 11C:
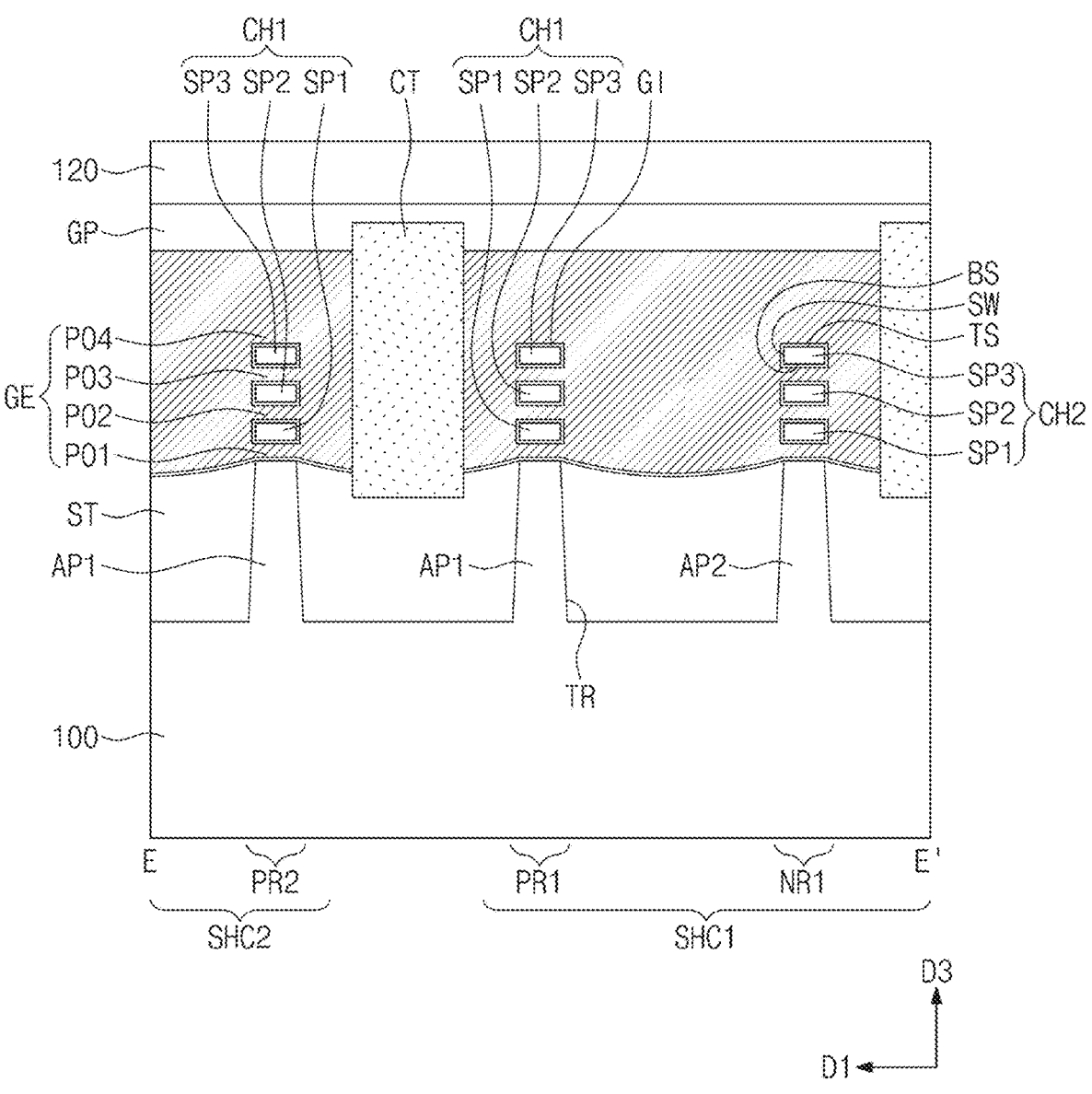
Figure 11D:
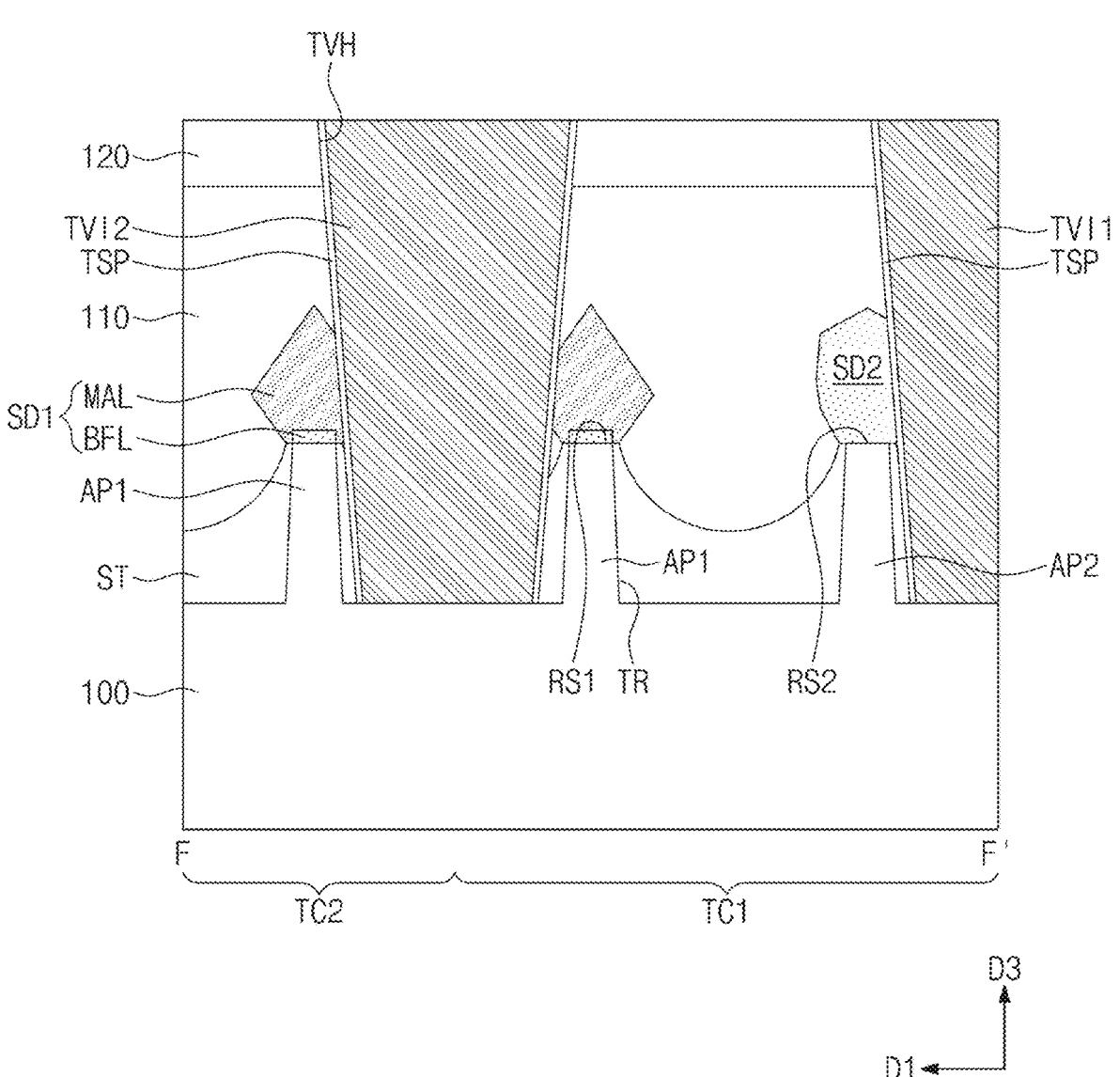

Referring to FIGS. 10A to 10C, the first interlayer insulating layer 110 may be formed to cover the first and second source/drain patterns SD1 and SD2, the hard mask patterns MP, and the gate spacers GS. In an embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, the first interlayer insulating layer 110 may be formed to have a top surface that is coplanar with the top surfaces of the sacrificial patterns PP and the top surfaces of the gate spacers GS.

A photolithography process may be performed to selectively open a region of the sacrificial pattern PP. For example, a region of the sacrificial pattern PP, which is located on a boundary between the first and second single height cells SHC1 and SHC2, may be selectively opened. The opened region of the sacrificial pattern PP may be selectively etched and removed. The gate cutting pattern CT may be formed by filling a space, which is formed by removing the sacrificial pattern PP, with an insulating material (e.g., see FIG. 10C).

In an embodiment, the exposed sacrificial patterns PP may be selectively removed. As a result of the removal of the sacrificial patterns PP, an outer region ORG may be formed to expose the first and second channel patterns CH1 and CH2 (e.g., see FIG. 10C). The removal of the sacrificial patterns PP may include a wet etching process which is performed using an etching solution capable of selectively etching polysilicon.

The second semiconductor layers SAL, which are exposed through the outer region ORG, may be selectively removed to form inner regions IRG (e.g., see FIG. 10C). In detail, an etching process of selectively etching the second semiconductor layers SAL may be performed to leave the first to third semiconductor patterns SP1, SP2, and SP3 and to remove only the second semiconductor layers SAL. An etch recipe for the etching process may be chosen to etch a layer (e.g., a silicon germanium layer), which is formed to have a relatively high germanium concentration, at a high etch rate. For example, the etching process may be chosen to have a high etch rate to a silicon germanium layer whose germanium concentration is higher than 10 at %.

During the etching process, the second semiconductor layers SAL may be completely removed from the first and second PMOSFET regions PR1 and PR2 and the first and second NMOSFET regions NR1 and NR2. The etching process may be a wet etching process. An etchant material, which is used in the etching process, may be chosen to quickly remove the second semiconductor layer SAL having a relatively high germanium concentration. Meanwhile, the first source/drain patterns SD1 on the first and second PMOSFET regions PR1 and PR2 may be protected from the etching process by the buffer layer BFL having a relatively low germanium concentration.

Referring back to FIG. 10C, as a result of the selective removal of the second semiconductor layers SAL, the stacked first to third semiconductor patterns SP1, SP2, and SP3 may be left on each of the first and second active patterns AP1 and AP2. Empty regions, which are formed by removing the second semiconductor layers SAL, may form first to third inner regions IRG1, IRG2, and IRG3, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 11A to 11D, the gate insulating layer GI may be conformally formed on the exposed first to third semiconductor patterns SP1, SP2, and SP3. The gate electrode GE may be formed on the gate insulating layer GI. The gate electrode GE may include the first to third inner electrodes PO1, PO2, and PO3, which are formed in the first to third inner regions IRG1, IRG2, and IRG3, and the outer electrode PO4, which is formed in the outer region ORG.

The gate electrode GE may be vertically recessed to have a reduced height. Upper portions of first and second gate cutting patterns CT1 and CT2 may be slightly recessed, during the recessing of the gate electrode GE. The gate capping pattern GP may be formed on the recessed gate electrode GE.

The second interlayer insulating layer 120 may be formed on the first interlayer insulating layer 110. The second interlayer insulating layer 120 may include a silicon oxide layer. The division structure DB may be formed on or along a boundary on the cells. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

Referring back to FIG. 11D, penetration holes TVH may be formed to penetrate the first and second interlayer insulating layers 110 and 120 and to expose the substrate 100. For example, at least one penetration hole TVH may be disposed on a boundary region between the first and second tab cells TC1 and TC2. The penetration hole TVH may be formed between a pair of the first active patterns AP1. The penetration hole TVH may be formed to expose a bottom of the trench TR, which is located between the pair of the first active patterns AP1. As a distance to the substrate 100 decreases, a width of the penetration hole TVH may decrease.

An upper spacer TSP may be formed on an inner side surface of the penetration hole TVH. The upper spacer TSP may be formed of or include at least one of silicon-based insulating materials. The penetration via TVI1-TVI3 may be formed by filling the penetration hole TVH with a metallic material.

Thereafter, the active contacts AC may be formed to penetrate the second interlayer insulating layer 120 and the first interlayer insulating layer 110 and to be electrically connected to the first and second source/drain patterns SD1 and SD2, as previously described with reference to FIG. 4 and FIGS. 5A to 5F. The gate contact GC may be formed to penetrate the second interlayer insulating layer 120 and the gate capping pattern GP and to be electrically connected to the gate electrode GE. The third interlayer insulating layer 130 may be formed on the active contacts AC and the gate contacts GC. The first metal layer M1 may be formed in the third interlayer insulating layer 130. The first metal layer M1 may include the first to third power lines M1_R1, M1_R2, and M1_R3, which are electrically connected to the first to third penetration vias TIM to TVI3, respectively. The fourth interlayer insulating layer 140 may be formed on the third interlayer insulating layer 130. The second metal layer M2 may be formed in the fourth interlayer insulating layer 140.

Referring to FIG. 12, after a BEOL process, the substrate 100 may be inverted such that the bottom surface 100b of the substrate 100 is exposed to the outside. A planarization process may be performed on the bottom surface 100b of the substrate 100 to reduce a thickness of the substrate 100.

Referring to FIG. 13, a patterning process may be performed on the bottom surface 100b of the substrate 100 to form the first to third lower penetration vias LVI1, LVI2, and LVI3. The first to third lower penetration vias LVI1, LVI2, and LVI3 may be vertically aligned to the first to third penetration vias TVI1, TVI2, and TVI3, respectively. The first to third lower penetration vias LVI1, LVI2, and LVI3 may be directly connected to the first to third penetration vias TVI1, TVI2, and TVI3, respectively. Thereafter, the power delivery network layer PDN may be formed on the bottom surface 100b of the substrate 100. The power delivery network layer PDN may be formed such that the source or drain voltage is applied to the first to third power lines M1_R1, M1_R2, and M1_R3.

Hereinafter, various embodiments of inventive concepts will be described. For concise description, an element previously described with reference to FIG. 4 and FIGS. 5A to 5F may be identified by the same reference number without repeating an overlapping description thereof.

Figure 14:
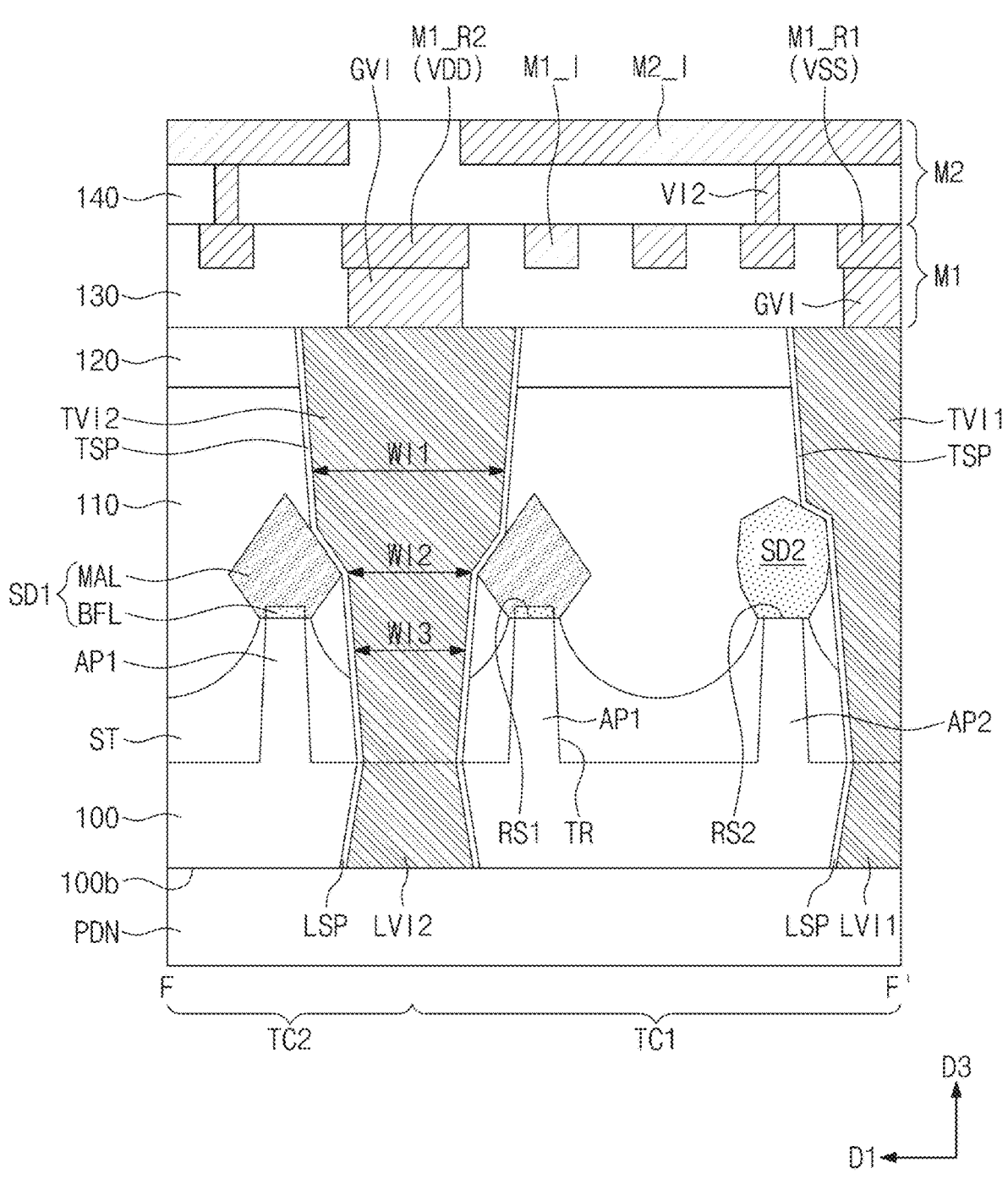
FIGS. 14 to 16 are sectional views, each of which is taken along the line F-F' of FIG. 4 to illustrate a semiconductor device according to an embodiment of inventive concepts.
Figure 15:
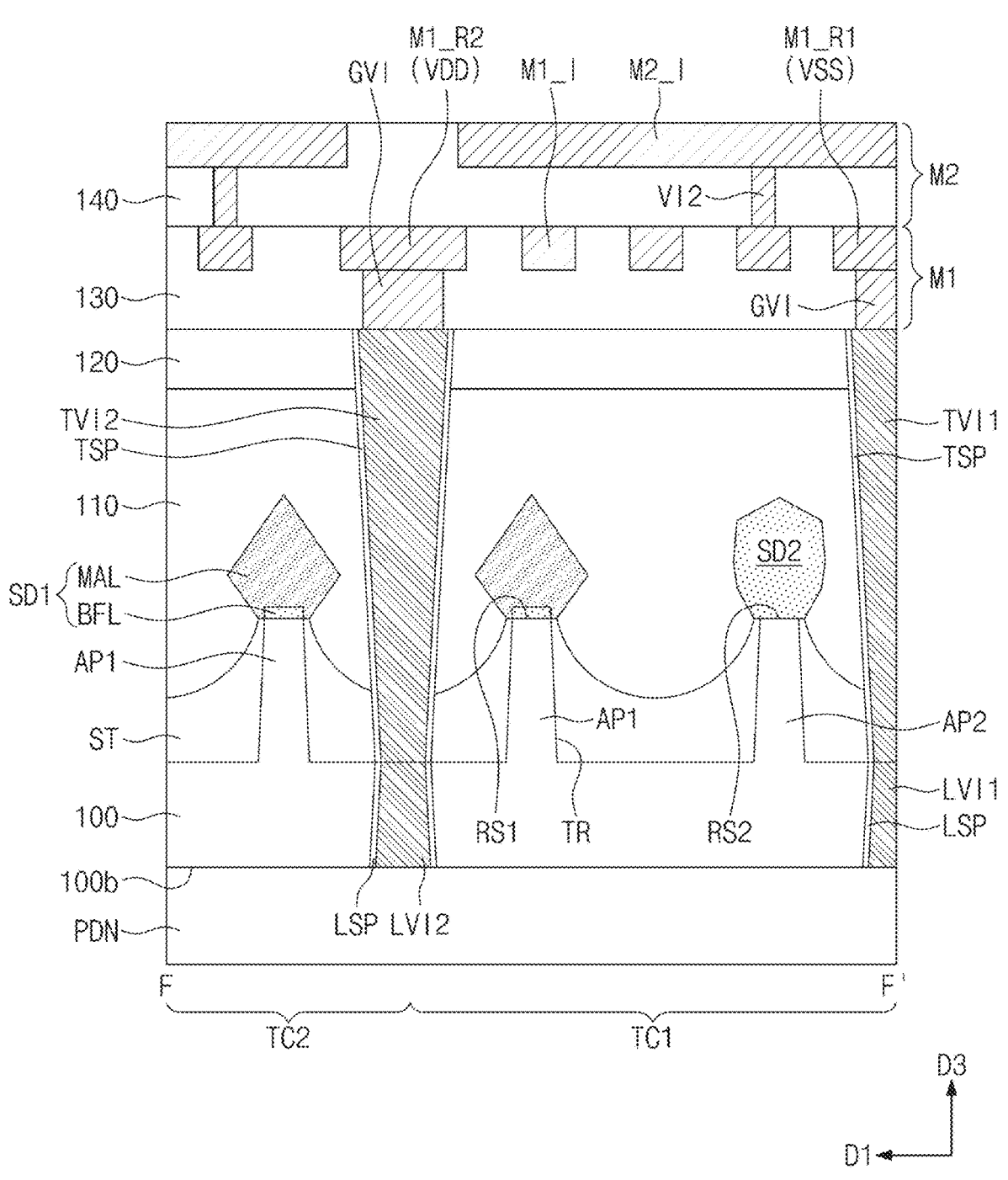
Figure 16:
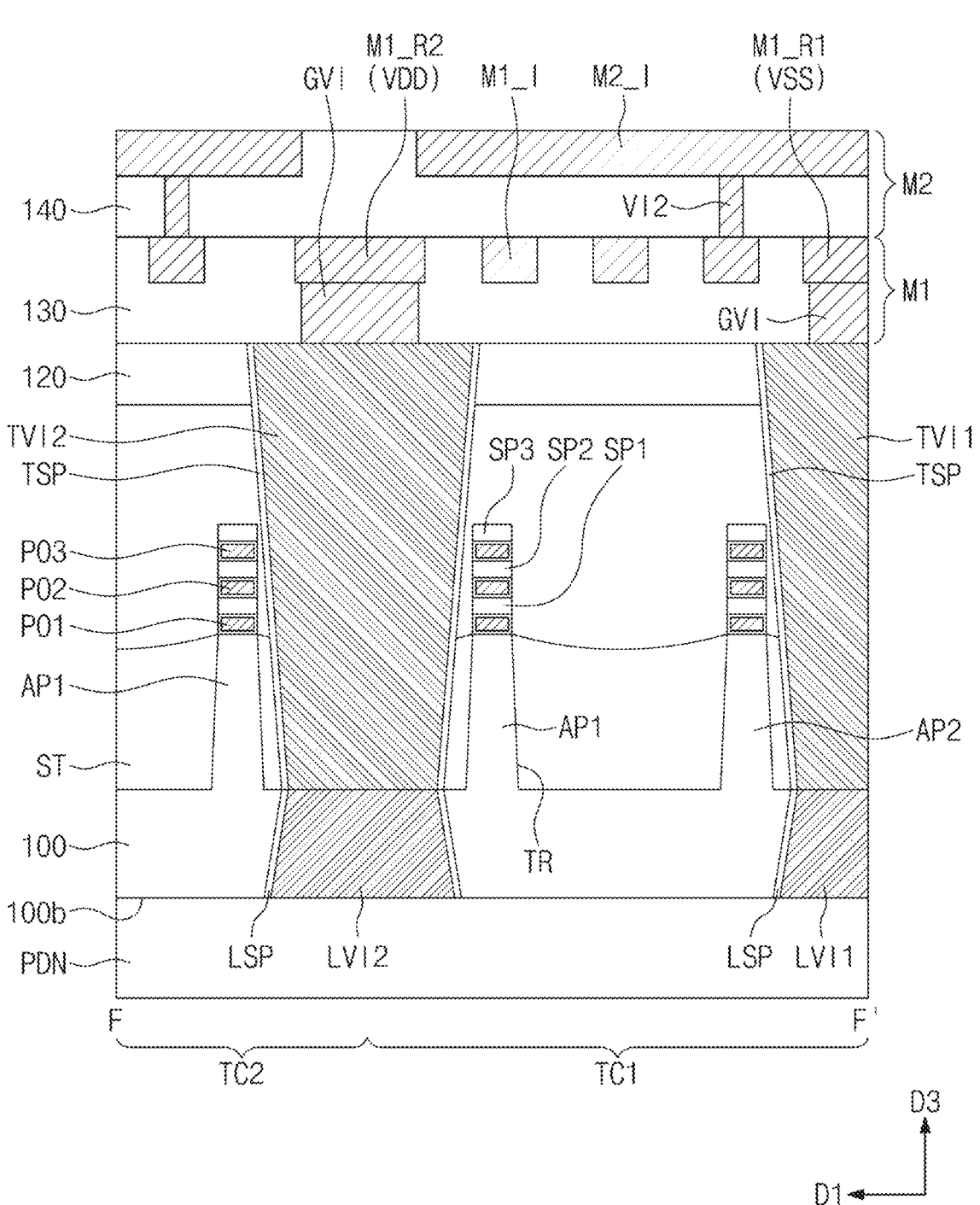

FIGS. 14 to 16 are sectional views, each of which is taken along the line F-F' of FIG. 4 to illustrate a semiconductor device according to an embodiment of inventive concepts.

Referring to FIG. 14, the second penetration via TVI2 may be, for example, formed between a pair of the first source/drain patterns SD1 in a self-aligned manner. The second penetration via TVI2 may not penetrate the first source/drain patterns SD1 and may be formed along a surface profile of the first source/drain pattern SD1. For example, an upper portion of the second penetration via TVI2 may have a first width WI1, a center portion of the second penetration via TVI2 may have a second width WI2, and a lower portion of the second penetration via TVI2 may have a third width WI3.

The second width WI2 may be substantially equal to a distance between a pair of the first source/drain patterns SD1. The first width WI1 may be larger than the distance between the pair of the first source/drain patterns SD1. The third width WI3 may be smaller than the distance between the pair of the first source/drain patterns SD1. A ratio of the third width WI3 to the first width WI1 (e.g., WI3/WI1) may range from 0.2 to 0.7.

Referring to FIG. 15, the second penetration via TVI2 may be, for example, provided between the pair of the first source/drain patterns SD1. The second penetration via TVI2 may be horizontally spaced apart from the pair of the first source/drain patterns SD1. A width of the second penetration via TVI2 may be equal to or smaller than a width of the second power line M1_R2. The width of the second penetration via TVI2 of FIG. 15 may be smaller than the width of the second penetration via TVI2 of FIG. 5F.

Referring to FIG. 16, a source/drain pattern (e.g., an epitaxial pattern) may not be formed on the first and second tab cells TC1 and TC2. A mask pattern may be formed on the first and second tab cells TC1 and TC2 when the first and second source/drain patterns SD1 and SD2 described with reference to FIGS. 8A to 9C are formed. Thus, the first semiconductor pattern SP1, the second semiconductor pattern SP2, and the third semiconductor pattern SP3, which are sequentially stacked, may be left on the first and second tab cells TC1 and TC2. The first to third inner electrodes PO1, PO2, and PO3 may be left on the first to third semiconductor patterns SP1, SP2, and SP3, respectively. The penetration via TVI1-TVI3 may be provided between the semiconductor patterns, which are stacked to be adjacent to each other.

Figure 17:
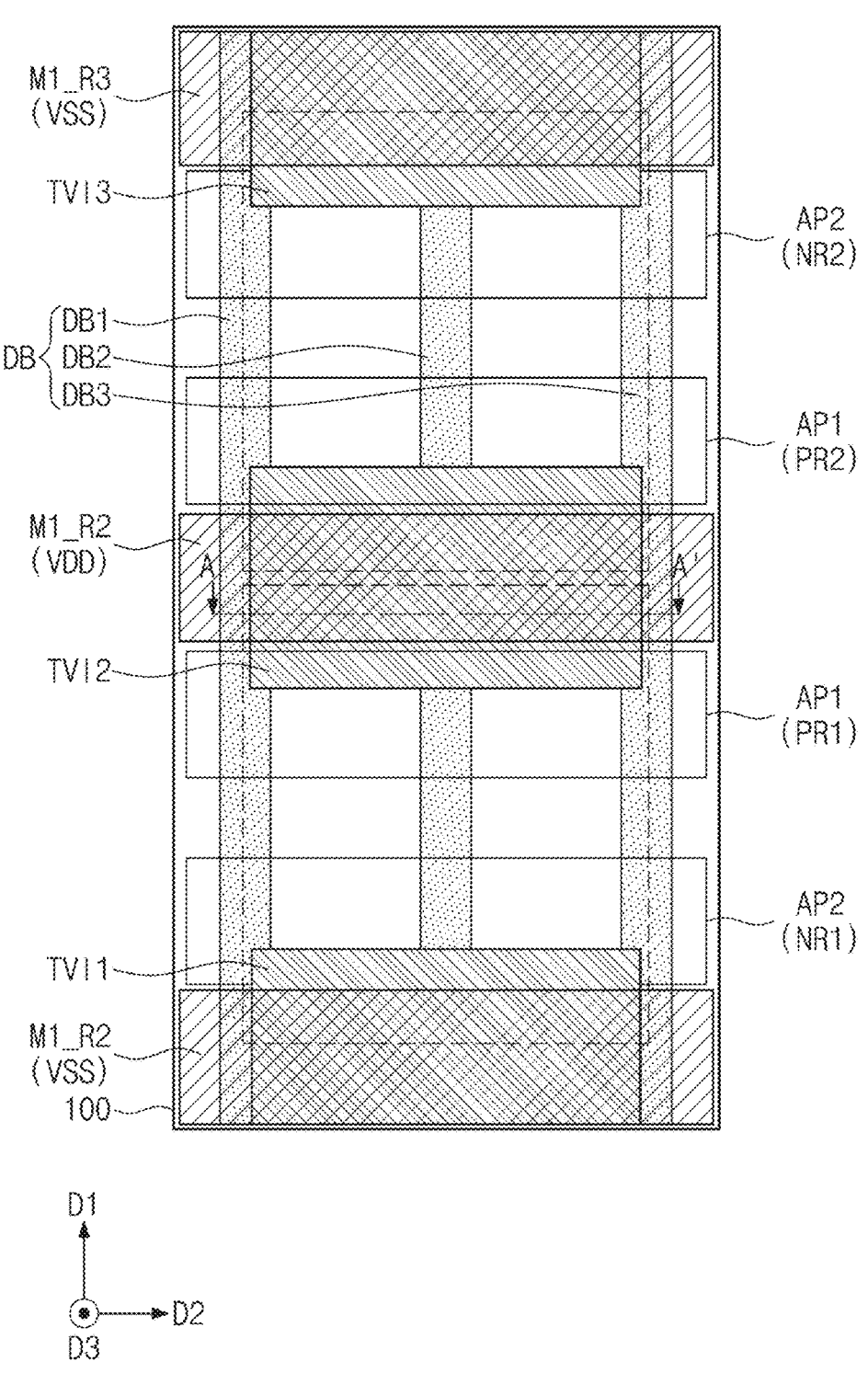
FIGS. 17, 19, and 21 are plan views, each of which illustrates a tab cell according to an embodiment of inventive concepts.
Figure 18:
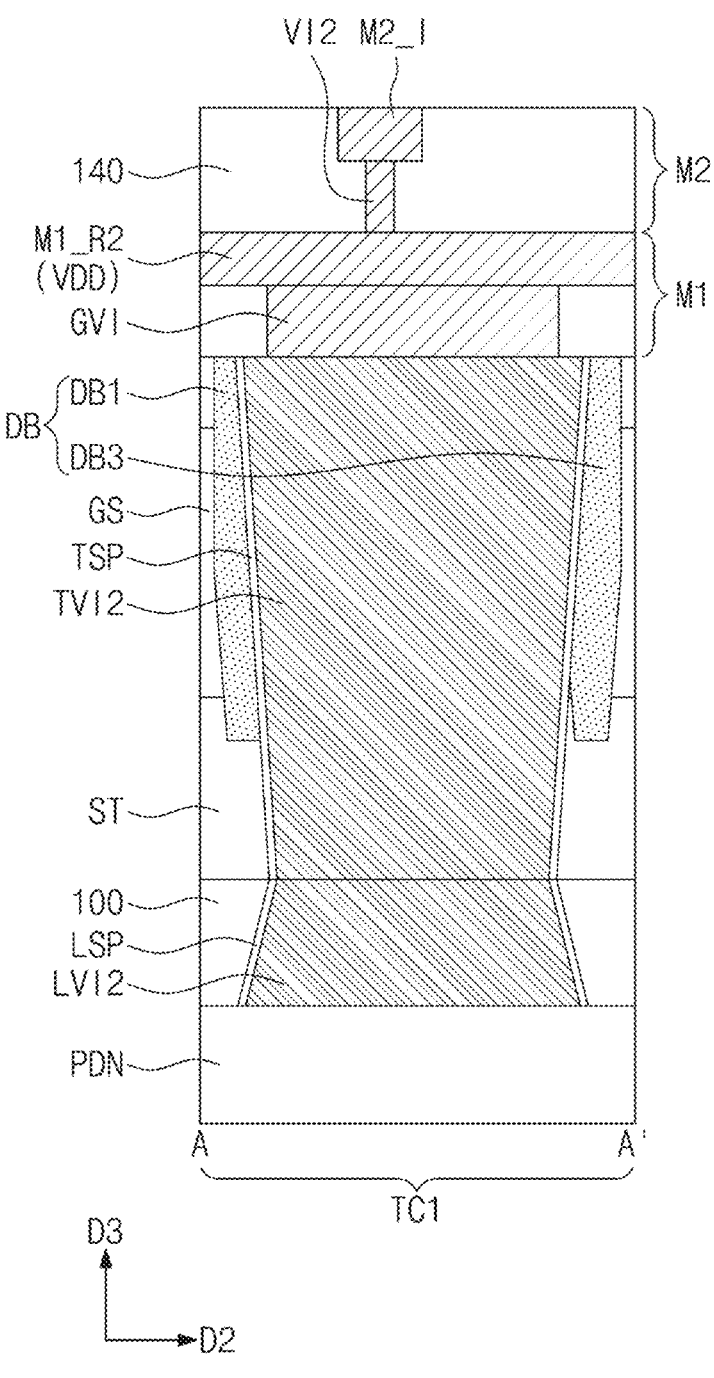
FIGS. 18, 20, and 22 are sectional views taken along lines A-A' of FIGS. 17, 19, and 21.
Figure 19:
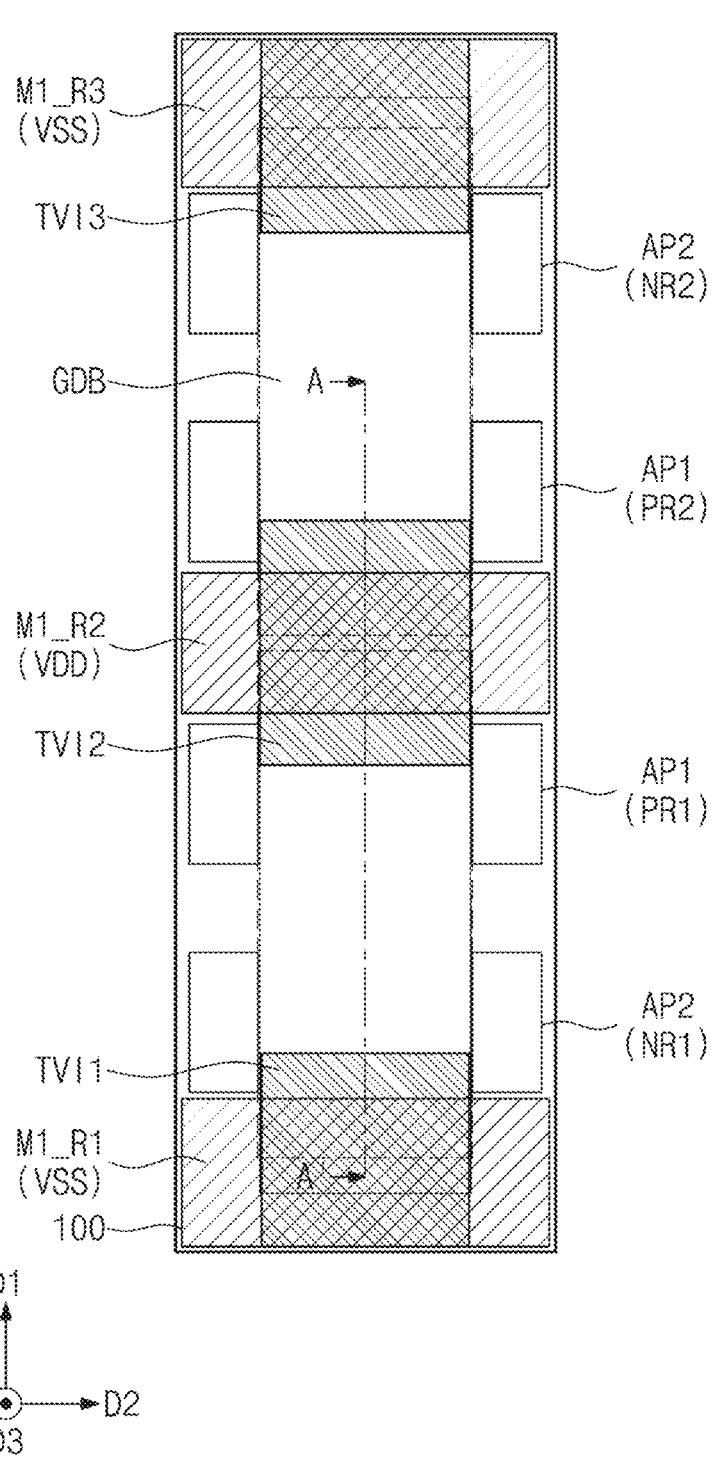
Figure 20:
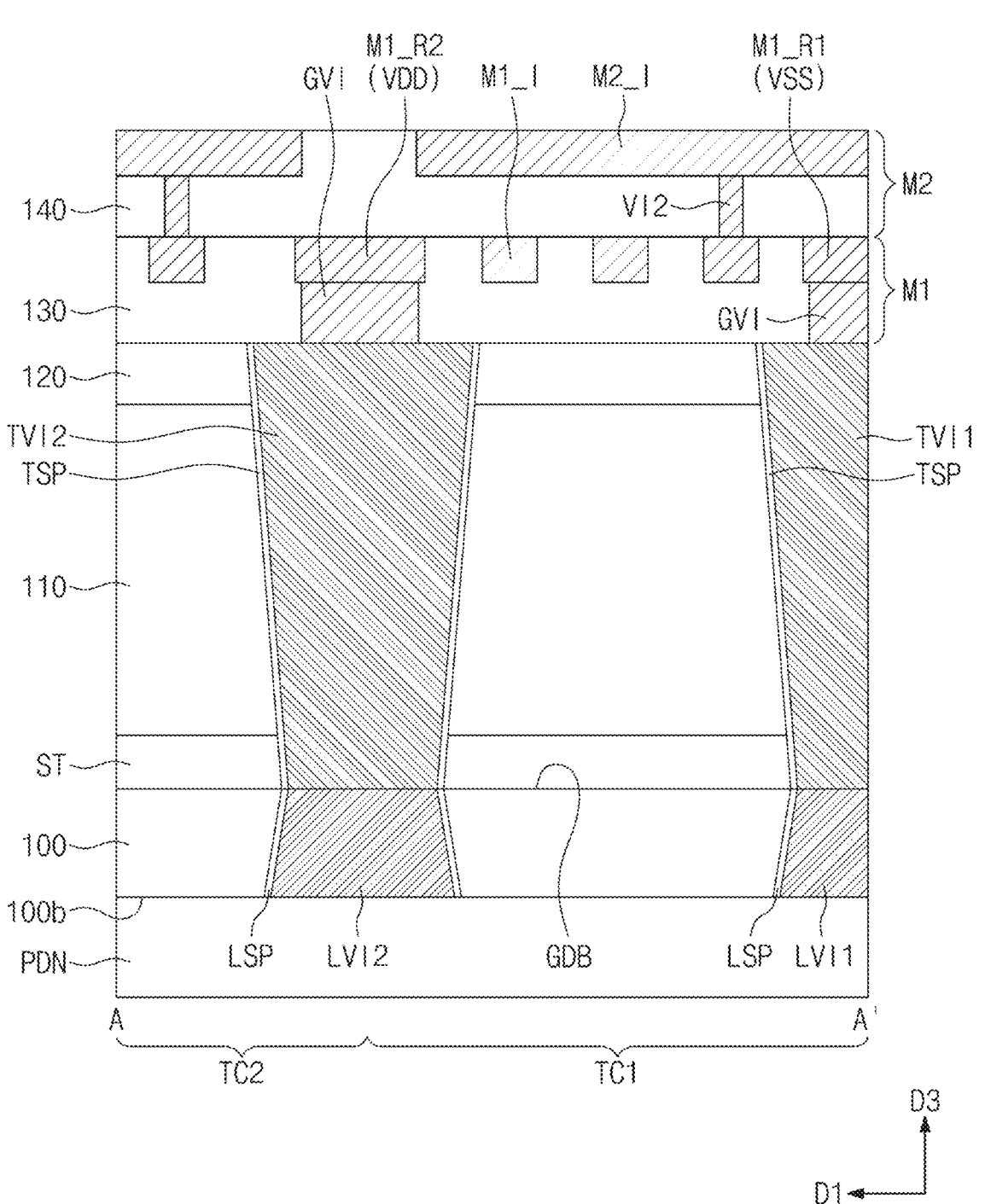
Figure 21:
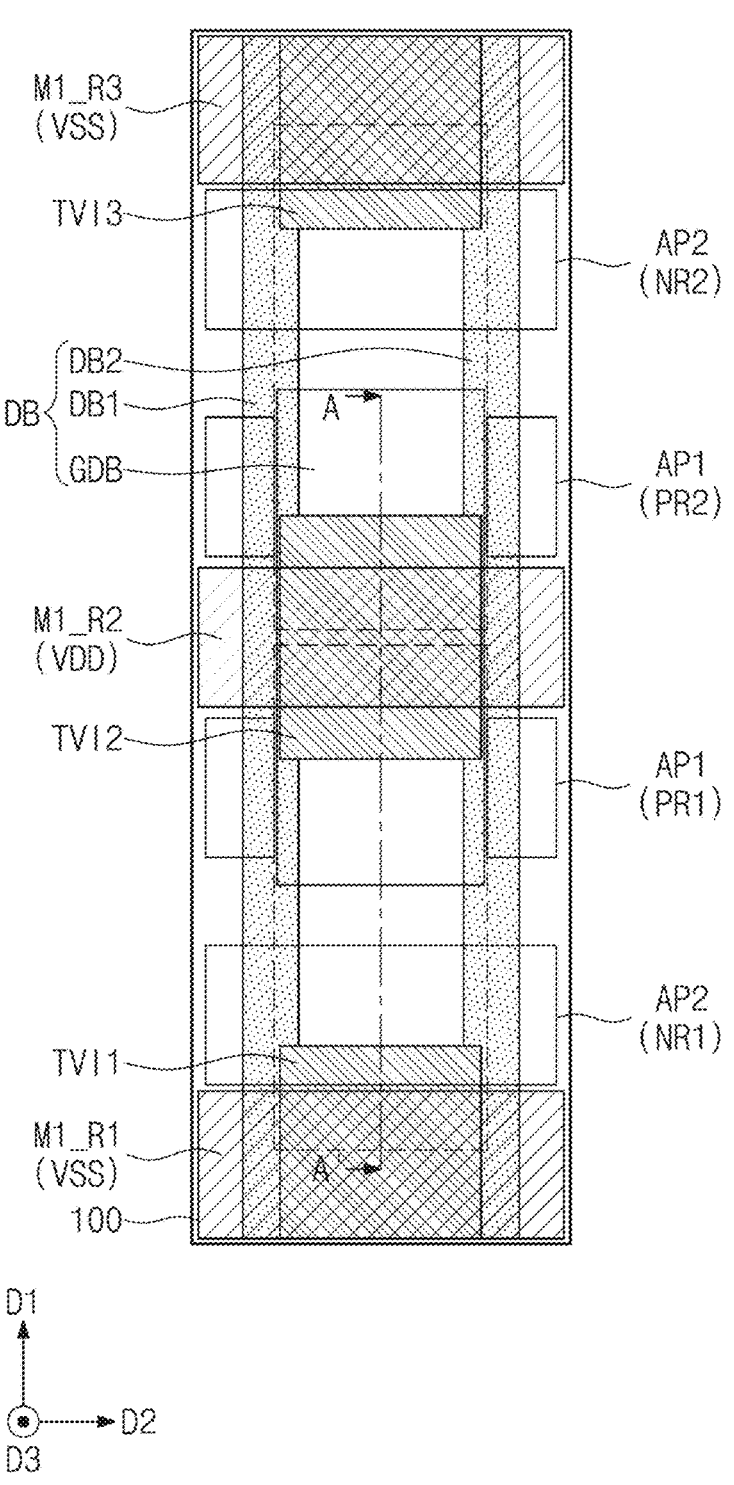
Figure 22:
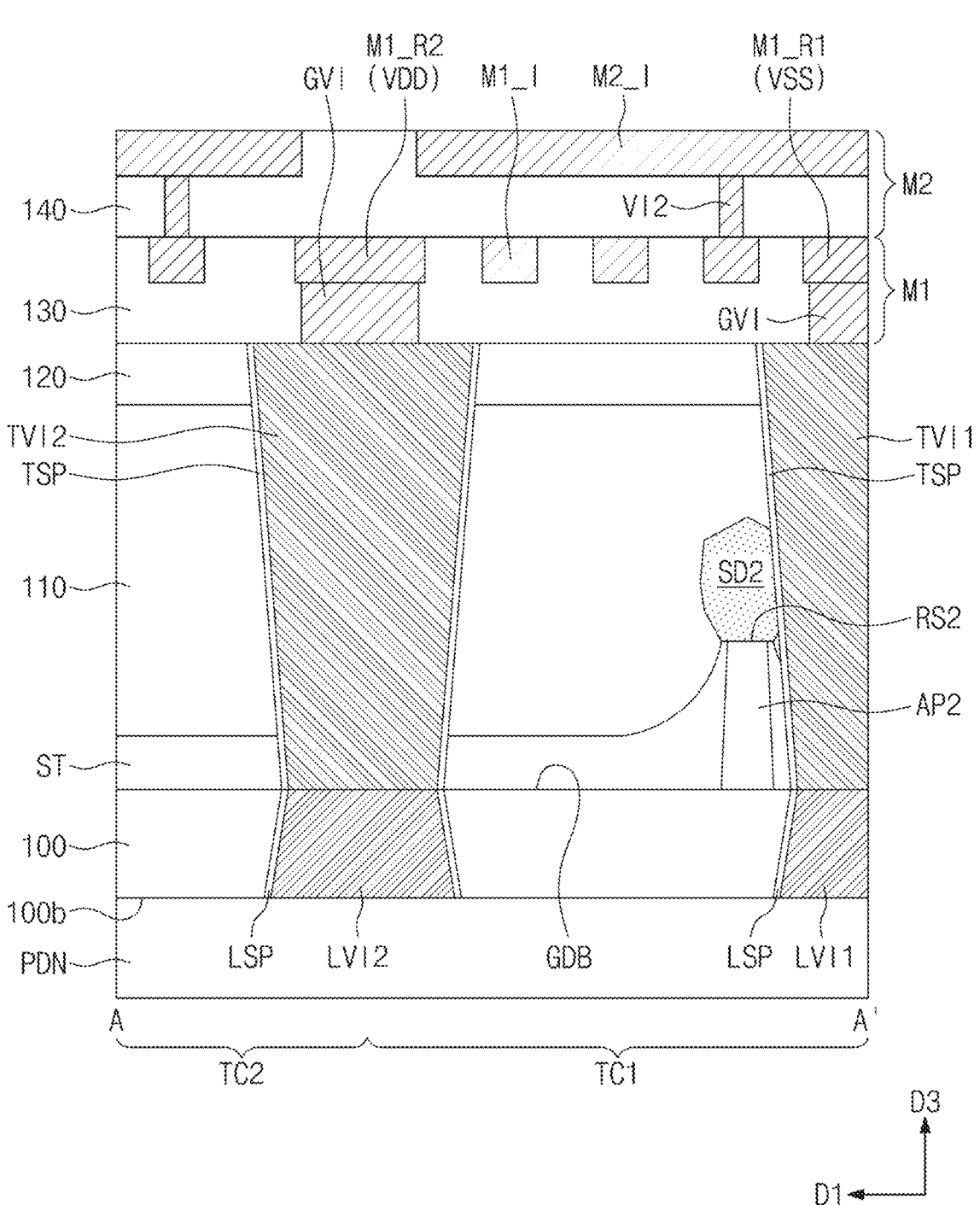

FIGS. 17, 19, and 21 are plan views, each of which illustrates a tab cell according to an embodiment of inventive concepts. FIGS. 18, 20, and 22 are sectional views taken along lines A-A' of FIGS. 17, 19, and 21.

Referring to FIGS. 17 and 18, a width of the tab cell TC1 or TC2 in the second direction D2 may be about two times the first pitch of the gate electrode. The first to third division structures DB1, DB2, and DB3 may be provided on the tab cell TC1 or TC2. Since the width of the tab cell TC1 or TC2 is increased, a width of the penetration via TVI1, TVI2, or TVI3 in the second direction D2 may be increased. This may make it possible to reduce an electric resistance between the penetration via TVI1, TVI2, or TVI3 and the power line M1_R1, M1_R2, or M1_R3.

Referring to FIGS. 19 and 20, a giant division structure GDB may be provided in the first and second tab cells TC1 and TC2. The giant division structure GDB may divide the first active pattern AP1 into a plurality of patterns, which are adjacent to each other in the second direction D2. The giant division structure GDB may divide the second active pattern AP2 into a plurality of patterns, which are adjacent to each other in the second direction D2. The giant division structure GDB may include the device isolation layer ST in place of the active region PR1, PR2, NR1, or NR2. In an embodiment, the giant division structure GDB may include a double diffusion brake. The first to third penetration vias TVI1 to TVI3 may be provided on the giant division structure GDB.

Referring to FIGS. 21 and 22, the division structure DB on the first and second tab cells TC1 and TC2 may include the giant division structure GDB, the first division structure DB1, and the second division structure DB2. The giant division structure GDB may be provided between the first active patterns AP1, which are adjacent to each other. The giant division structure GDB may remove the first and second PMOSFET regions PR1 and PR2.

The first and second division structures DB1 and DB2 may be provided on the second active pattern AP2. Since the giant division structure GDB is not provided on the first and second NMOSFET regions NR1 and NR2, the first and second NMOSFET regions NR1 and NR2 may not be removed and may remain unchanged.

The first and third penetration vias TVI1 and TVI3 may be provided between the first and second division structures DB1 and DB2. The second penetration via TVI2 may be provided on the giant division structure GDB.

Figure 23:
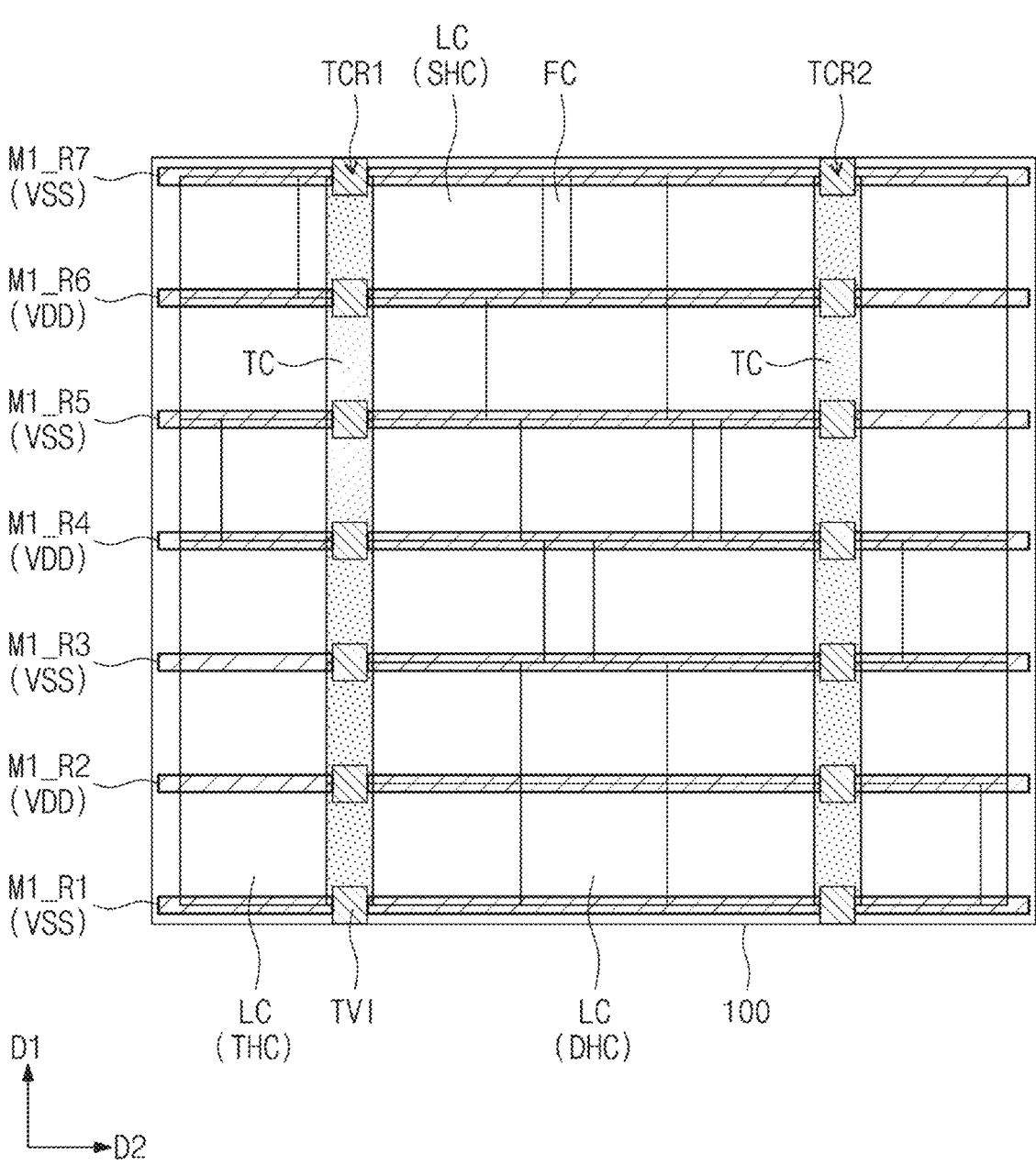
FIGS. 23 and 24 are plan views, each of which illustrates an arrangement of tab cells and logic cells, which are disposed in a semiconductor device according to an embodiment of inventive concepts.
Figure 24:
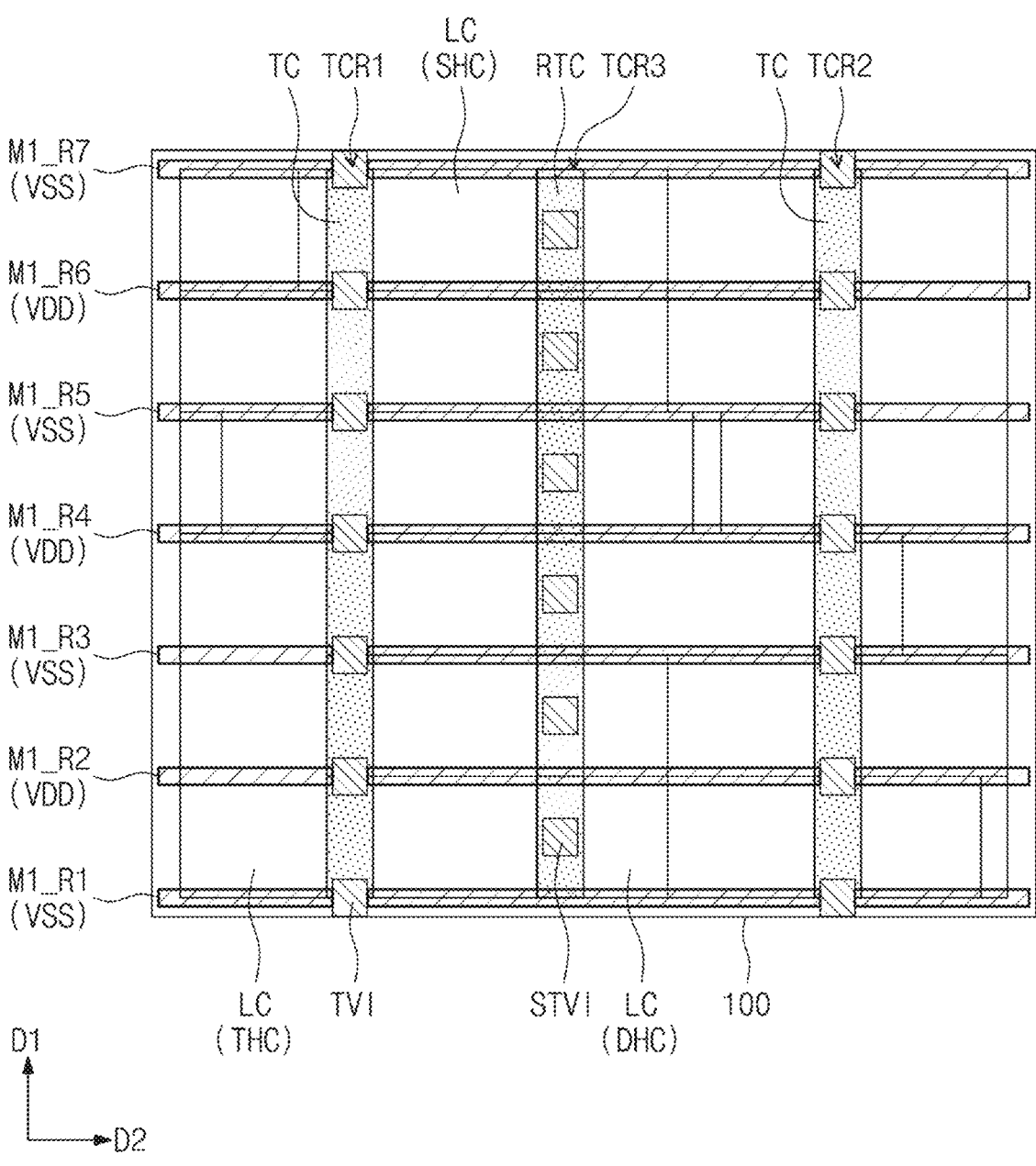

FIGS. 23 and 24 are plan views, each of which illustrates an arrangement of tab cells and logic cells, which are disposed in a semiconductor device according to an embodiment of inventive concepts.

Referring to FIG. 23, the first to seventh power lines M1_R1 to M1_R7 may be disposed in the first direction D1 on the substrate 100. A first tab cell track TCR1 and a second tab cell track TCR2 may be provided on the substrate 100. Each of the first and second tab cell tracks TCR1 and TCR2 may be extended in the first direction D1. The first and second tab cell tracks TCR1 and TCR2 may be arranged at a specific pitch in the second direction D2.

On each of the first and second tab cell tracks TCR1 and TCR2, tab cells TC may be disposed in the first direction D1.

For example, each of the tab cells TC in the present embodiment may be the tab cell TC1 or TC2 of FIG. 4.

On each of the first and second tab cell tracks TCR1 and TCR2, the penetration vias TVI may be disposed in the first direction D1. The penetration vias TVI may be coupled to the first to seventh power lines M1_R1 to M1_R7, respectively. The penetration vias TVI may be used to apply voltages from the power delivery network layer PDN to the first to seventh power lines M1_R1 to M1_R7.

Logic cells LC and filler cells FC may be disposed on the substrate 100. The logic cells LC may be placed on a remaining region, in which the tab cells TC are not disposed. The logic cells LC may be placed on the substrate 100, based on the designed circuit. As an example, the logic cells LC may include at least one single height cell SHC, at least one double height cell DHC, and at least one triple height cell THC. The filler cell FC may be provided to fill an empty space between the logic cells LC, which are adjacent to each other. The filler cell FC may be a dummy cell.

Referring to FIG. 24, a third tab cell track TCR3 may be provided between the first and second tab cell tracks TCR1 and TCR2. Routing tab cells RTC may be disposed in the third tab cell track TCR3 in the first direction D1. Each of the routing tab cells RTC may include a signal penetration via STVI. The signal penetration via STVI may have sub- stantially the same shape as the penetration via TVI described above. The signal penetration via STVI may be provided between the PMOSFET and NMOSFET regions. The signal penetration via STVI may be electrically con- nected to the power delivery network layer PDN.

The signal penetration via STVI may be electrically connected to the logic cells LC adjacent to the third tab cell track TCR3. For example, a signal may be transmitted from the logic cell LC to the routing tab cell RTC through the first interconnection line M1_I in the first metal layer M1. The signal, which is transmitted to the routing tab cell RTC, may be connected to another logic cell LC through the power delivery network layer PDN. That is, the power delivery network layer PDN may be configured to provide a voltage to at least one of the power lines M1_R1 to M1_R7 as well as to serve as a routing structure for signal transmission.

The routing tab cell RTC in the present embodiment may allow for the signal transmission in the semiconductor device not only through a BEOL layer (e.g., the first and second metal layers M1 and M2), but also through the power delivery network layer PDN below the substrate 100. Accordingly, it may be possible to reduce complexity in interconnection structure of the BEOL layer and to increase an integration density of the semiconductor device. Addi- tionally, an electric resistance of the signal transmission path may be reduced, leading to an improvement in the electrical characteristics of the semiconductor device.

According to an embodiment of inventive concepts, a semiconductor device may include a power tab cell having substantially the same width as a pitch of a gate electrode. Thus, it may be possible to increase an occupying area of logic cells in a logic die and thereby to increase an integra- tion density of the semiconductor device.

Tab cells in a tab cell track may include penetration vias corresponding to power lines, respectively. Accordingly, it may be possible to supply a voltage from a power delivery network to all of power lines using only one tab cell track with a small width. As a result, electrical characteristics of the semiconductor device may be improved.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate;
first active patterns adjacent to each other on the substrate;
first source/drain patterns respectively on the first active patterns and adjacent to each other;
a first division structure and a second division structure crossing the first active patterns and arranged on the substrate such that adjacent ones of the first source/ drain patterns are between the first division structure and the second division structure;
a first penetration via between the adjacent ones of the first source/drain patterns in a cross-sectional view;
a first power line on the first penetration via and electri- cally connected to the first penetration via;
a power delivery network layer on a bottom surface of the substrate; and
a first lower penetration via between the power delivery network layer and the first penetration via,
wherein the first penetration via between the first power line and the first lower penetration via.

2. The semiconductor device of claim 1, further compris- ing:
a second active pattern on the substrate; and
a second source/drain pattern, wherein
the second source/drain pattern is on the second active pattern,
the second source/drain pattern is between the first divi- sion structure and the second division structure,
the second source/drain pattern is adjacent to a one of the first source/drain patterns, and
the first penetration via is spaced apart from a region between the second source/drain pattern and the one of the first source/drain patterns.

3. The semiconductor device of claim 2, further compris- ing:
interconnection lines on the region between the second source/drain pattern and the one of the first source/drain patterns, wherein
the interconnection lines are at a same level as the first power line.

4. The semiconductor device of claim 1, further compris- ing:
second active patterns adjacent to each other on the substrate;
second source/drain patterns respectively on the second active patterns adjacent to each other, the second source/drain patterns between the first division struc- ture and the second division structure;
a second penetration via between adjacent ones of the second source/drain patterns;
a second power line, which is provided on the second penetration via and is electrically connected to the second penetration via; and
a second lower penetration via, which is provided between the power delivery network layer and the second penetration via.

5. The semiconductor device of claim 4, wherein
the power delivery network layer is configured to apply a source voltage to one of the first power line and the second power line, and
the power delivery network layer is configured to apply a drain voltage to an other of the first power line and the second power line.

6. The semiconductor device of claim 1, wherein an upper portion of the first penetration via has a first width, a center portion of the first penetration via has a second width, a lower portion of the first penetration via has a third width, the first width is larger than a distance between the first source/drain patterns, and the third width is smaller than the distance between the first source/drain patterns.

7. The semiconductor device of claim 6, wherein the second width is equal to the distance between the first source/drain patterns.

8. The semiconductor device of claim 1, wherein as a distance to the bottom surface of the substrate decreases, a width of the first penetration via decreases, and as the distance to the bottom surface of the substrate decreases, a width of the first lower penetration via increases.

9. The semiconductor device of claim 1, wherein the first penetration via is between the first division structure and the second division structure.

10. The semiconductor device of claim 1, further comprising:

a plurality of semiconductor patterns on each of the first active patterns, wherein the plurality of semiconductor patterns are stacked on each other and spaced apart from each other, and the plurality of semiconductor patterns are connected to a corresponding one of the first source/drain patterns.

11. A semiconductor device, comprising:

a substrate;

a plurality of power lines on the substrate, the plurality of power lines arranged in a first direction and extending in a second direction, the plurality of power lines being parallel to each other;

a plurality of logic cells two-dimensionally provided on an active region of the substrate;

a plurality of tab cells arranged in the first direction on the substrate; and a power delivery network layer below the substrate, wherein the plurality of tab cells include a plurality of penetration vias, the plurality of penetration vias are electrically connected to the plurality of power lines, respectively, the power delivery network layer is configured to apply voltages to the plurality of power lines through the plurality of penetration vias, the plurality of logic cells include a plurality of gate electrodes, the plurality of gate electrodes are in the second direction, a width of each of the plurality of tab cells in the second direction is equal to a pitch between the plurality of gate electrodes or the width of each of the plurality of tab cells is two times the pitch between the plurality of gate electrodes, wherein each of the plurality of tab cells includes a first division structure and a second division structure, wherein the first division structure and the second division structure are on two borders in each of the plurality of tab cells, and wherein the first division structure and the second division structure include an insulating material.

12. The semiconductor device of claim 11, wherein each of the plurality of tab cells includes a giant division structure in place of the active region.

13. The semiconductor device of claim 11, wherein each of the plurality of tab cells comprises a giant division structure, a first division structure, and a second division structure, the giant division structure is in place of the active region, the first division structure and the second division structure are on two borders in each of the plurality of tab cells.

14. The semiconductor device of claim 11, further comprising:

a plurality of routing tab cells arranged in the first direction on the substrate; and a plurality of interconnection lines on the plurality of logic cells, wherein the plurality of routing tab cells comprise a plurality of signal penetration vias, the plurality of signal penetration vias are electrically connected to the plurality of interconnection lines, respectively, and the power delivery network layer is configured to deliver signals between at least two of the plurality of logic cells through the plurality of signal penetration vias.

15. A semiconductor device, comprising:

a substrate;

a first power line and a second power line on the substrate, the first power line and the second power line being spaced apart from each other in a first direction and extending in a second direction to be parallel to each other;

a logic cell and a tab cell between the first power line and the second power line, the logic cell and the tab cell being adjacent to each other in the second direction;

a first active pattern and a second active pattern on the logic cell, the first active pattern and the second active pattern being spaced apart from each other in the first direction;

a first channel pattern and a first source/drain pattern on the first active pattern;

a second channel pattern and a second source/drain pattern on the second active pattern, a conductivity type of the second source/drain pattern being different than a conductivity type of the first source/drain pattern;

a gate electrode on the first channel pattern and the second channel pattern;

a gate insulating layer between the gate electrode and the first channel pattern and the second channel pattern;

a gate spacer on a side surface of the gate electrode;

a gate capping pattern on a top surface of the gate electrode;

an interlayer insulating layer covering the first source/drain pattern, the second source/drain pattern, and the gate capping pattern;

an active contact penetrating the interlayer insulating layer and being electrically connected to each of the first source/drain pattern and the second source/drain pattern;

a metal-semiconductor compound layer between the active contact and each of the first source/drain pattern and the second source/drain pattern;

a gate contact penetrating the interlayer insulating layer and the gate capping pattern, the gate contact being electrically connected to the gate electrode;

a first division structure and a second division structure respectively provided on two borders of the tab cell, which are opposite each other in the second direction;

a first penetration via and a second penetration via on the tab cell, the first penetration via and the second penetration via being electrically connected to the first power line and the second power line, respectively, and the first penetration via and the second penetration via each being interposed between the first division structure and the second division structure;

a power delivery network layer on a bottom surface of the substrate;

a first lower penetration via and a second lower penetration via, which are respectively provided between the power delivery network layer and the first penetration via and the second penetration via, wherein as a distance to the bottom surface of the substrate decreases, a width of each of the first penetration via and the second penetration via decreases, as the distance to the bottom surface of the substrate decreases, a width of each of the first lower penetration via and the second lower penetration via increases.

16. The semiconductor device of claim 15, wherein the first channel pattern and the second channel pattern each comprise a plurality of semiconductor patterns, which are stacked to be spaced apart from each other.

17. The semiconductor device of claim 15, wherein the power delivery network layer is configured to apply a source voltage to one of the first power line and the second power line, and the power delivery network layer is configured to apply a drain voltage to an other of the first power line and the second power line.

18. The semiconductor device of claim 15, further comprising:

interconnection lines on the logic cell, wherein the interconnection lines are electrically connected to the active contact and the gate contact, respectively, and the interconnection lines are at a same level as the first power line and the second power line.

* * * * *